(12) United States Patent
Lee et al.

(10) Patent No.: US 12,341,084 B2
(45) Date of Patent: Jun. 24, 2025

(54) INTEGRATED CIRCUIT DEVICE WITH THROUGH-ELECTRODE AND ELECTRODE LANDING PAD, AND SEMICONDUCTOR PACKAGE INCLUDING THE SAME

(71) Applicant: Samsung Electronics Co., Ltd., Suwon-si (KR)

(72) Inventors: Hojin Lee, Hwaseong-si (KR); Kwangjin Moon, Hwaseong-si (KR); Seungha Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 175 days.

(21) Appl. No.: 17/560,495

(22) Filed: Dec. 23, 2021

(65) Prior Publication Data

US 2022/0367320 A1 Nov. 17, 2022

(30) Foreign Application Priority Data

May 14, 2021 (KR) .......................... 10-2021-0062814

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76898* (2013.01); *H01L 23/49811* (2013.01);
(Continued)

(58) Field of Classification Search
CPC ............. H01L 23/481; H01L 23/49811; H01L 23/485; H01L 23/49816; H01L 23/5389;
(Continued)

(56) References Cited

U.S. PATENT DOCUMENTS

| 7,843,068 B2 | 11/2010 | Murayama et al. |
| 8,263,856 B2 | 9/2012 | Cornfeld et al. |
| 8,729,711 B2 | 5/2014 | Nishio |
| 9,543,257 B2 | 1/2017 | Tsai et al. |

(Continued)

FOREIGN PATENT DOCUMENTS

| KR | 1020150043933 A | 4/2015 |
| KR | 1020170068308 A | 6/2017 |

(Continued)

*Primary Examiner* — Marcos D. Pizarro
*Assistant Examiner* — Tiberiu Dan Onuta
(74) *Attorney, Agent, or Firm* — Muir Patent Law, PLLC

(57) ABSTRACT

An integrated circuit device includes a semiconductor substrate having a first surface and a second surface opposite to the first surface, a first insulating layer on the first surface of the semiconductor substrate, an electrode landing pad positioned on the first surface of the semiconductor substrate and having a sidewall surrounded by the first insulating layer, a top surface apart from the first surface of the semiconductor substrate, and a bottom surface opposite to the top surface, and a through-electrode configured to penetrate through the semiconductor substrate and contact the top surface of the electrode landing pad, wherein a horizontal width of the top surface of the electrode landing pad is less than a horizontal width of the bottom surface of the electrode landing pad and greater than a horizontal width of a bottom surface of the through-electrode in contact with the top surface of the electrode landing pad.

17 Claims, 28 Drawing Sheets

(51) Int. Cl.
*H01L 23/00* (2006.01)
*H01L 23/498* (2006.01)
*H01L 25/065* (2023.01)

(52) U.S. Cl.
CPC .............. *H01L 24/05* (2013.01); *H01L 24/13* (2013.01); *H01L 25/0657* (2013.01); *H01L 2224/05548* (2013.01); *H01L 2224/13008* (2013.01); *H01L 2225/06513* (2013.01); *H01L 2225/06544* (2013.01)

(58) Field of Classification Search
CPC ......... H01L 23/49827; H01L 23/49838; H01L 23/5384; H01L 23/5386; H01L 23/5226; H01L 21/76898; H01L 24/05; H01L 24/13; H01L 24/16; H01L 24/20; H01L 25/0657; H01L 2224/05548; H01L 2224/13008; H01L 2225/06513; H01L 2225/06544; H01L 2225/06524; H01L 2225/06548
See application file for complete search history.

(56) References Cited

U.S. PATENT DOCUMENTS

| | | | |
|---|---|---|---|
| 9,666,551 B1* | 5/2017 | Seo | H01L 23/481 |
| 9,786,619 B2 | 10/2017 | Chen et al. | |
| 11,342,221 B2* | 5/2022 | Hwang | H01L 21/76805 |
| 2012/0228780 A1* | 9/2012 | Kim | H01L 23/481 |
| | | | 257/E23.145 |
| 2014/0264862 A1 | 9/2014 | Tsai et al. | |
| 2015/0102497 A1* | 4/2015 | Park | H01L 21/76898 |
| | | | 257/774 |
| 2016/0351472 A1* | 12/2016 | Park | H01L 23/481 |
| 2019/0386051 A1* | 12/2019 | Hong | H01L 27/1469 |
| 2020/0075458 A1* | 3/2020 | Lee | H01L 23/5226 |
| 2020/0205279 A1 | 6/2020 | Ecton et al. | |
| 2020/0306552 A1 | 10/2020 | Tsai et al. | |
| 2021/0375722 A1 | 12/2021 | Kim et al. | |

FOREIGN PATENT DOCUMENTS

| | | |
|---|---|---|
| KR | 1020190141472 A | 12/2019 |
| KR | 1020200026590 A | 3/2020 |
| KR | 1020210028801 A | 3/2021 |

* cited by examiner

INTEGRATED CIRCUIT DEVICE WITH THROUGH-ELECTRODE AND ELECTRODE LANDING PAD, AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2021-0062814, filed on May 14, 2021, in the Korean Intellectual Property Office, the disclosure of which is incorporated by reference herein in its entirety.

BACKGROUND

The inventive concept relates to an integrated circuit (IC) device and a semiconductor package including the same, and more particularly, to an IC device including a through-electrode and a semiconductor package including the IC device.

In an IC device, a through-electrode connecting wirings (or terminals) with each other through a substrate is used. As IC devices increasingly have a high degree of integration, a technology for reliably forming a through-electrode, while reducing a size (a diameter or a width) of the through-electrode, is in demand.

SUMMARY

The inventive concept provides an IC device and a semiconductor package including the same.

According to an aspect of the inventive concept, there is provided an integrated circuit device including a semiconductor substrate having a first surface and a second surface opposite to the first surface, a first insulating layer on the first surface of the semiconductor substrate, an electrode landing pad on the first surface of the semiconductor substrate, the electrode landing pad having a sidewall surrounded by the first insulating layer, a top surface spaced apart from the first surface of the semiconductor substrate, and a bottom surface opposite to the top surface, and a through-electrode penetrating through the semiconductor substrate and contacting the top surface of the electrode landing pad, wherein a horizontal width of the top surface of the electrode landing pad is less than a horizontal width of the bottom surface of the electrode landing pad and greater than a horizontal width of a bottom surface of the through-electrode in contact with the top surface of the electrode landing pad.

According to another aspect of the inventive concept, there is provided an integrated circuit device including a semiconductor substrate having a first surface and a second surface opposite to the first surface, a first insulating layer on the first surface of the semiconductor substrate, a passivation layer on the second surface of the semiconductor substrate, an electrode landing pad on the first surface of the semiconductor substrate, the electrode landing pad having a sidewall surrounded by the first insulating layer, a top surface facing the first surface of the semiconductor substrate, and a bottom surface opposite to the top surface, a through-electrode penetrating through the semiconductor substrate and the passivation layer and contacting the top surface of the electrode landing pad, a pad insulating layer provided between the electrode landing pad and the first surface of the semiconductor substrate, a first interconnect structure connected to the first insulating layer, the first interconnect structure including a plurality of first conductive lines electrically connected to the through-electrode through the electrode landing pad and a first conductive via extending between the plurality of first conductive lines, and a second interconnect structure on the passivation layer, the second interconnect structure including a plurality of second conductive lines electrically connected to the through-electrode and a second conductive via extending between the plurality of second conductive lines, wherein the through-electrode has a tapered shape with a horizontal width narrowing toward the first surface of the semiconductor substrate and the electrode landing pad has a tapered shape with a horizontal width narrowing toward the first surface of the semiconductor substrate.

According to another aspect of the inventive concept, there is provided a semiconductor package including a first redistribution structure and a first integrated circuit device mounted on the first redistribution structure, wherein the first integrated circuit device includes a semiconductor substrate having a first surface and a second surface opposite to the first surface and facing the first redistribution structure, a first insulating layer on the first surface of the semiconductor substrate, an electrode landing pad provided on the first surface of the semiconductor substrate, the electrode landing pad having a sidewall surrounded by the first insulating layer, a top surface spaced apart from the first surface of the semiconductor substrate, and a bottom surface opposite to the top surface, and a through-electrode penetrating through the semiconductor substrate and contacting the top surface of the electrode landing pad, wherein the through-electrode has a tapered shape with a horizontal width narrowing toward the first surface of the semiconductor substrate and the electrode landing pad has a tapered shape with a horizontal width narrowing toward the first surface of the semiconductor substrate.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
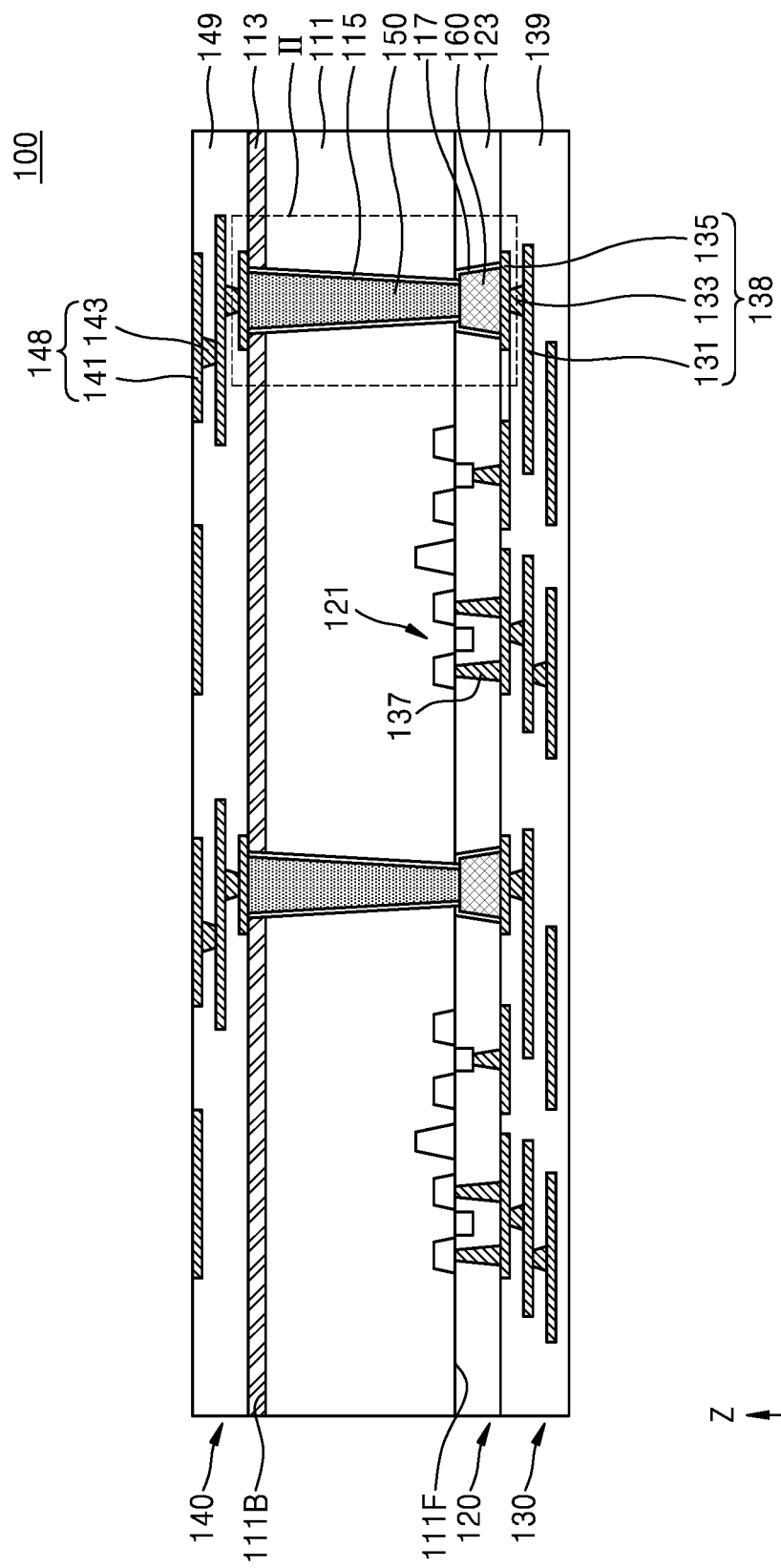
FIG. 1 is a cross-sectional view illustrating an integrated circuit (IC) device according to example embodiments of the inventive concept.

Hereinafter, embodiments of the technical idea of the inventive concept will be described in detail with reference to the accompanying drawings. The same reference numerals are used for the same components in the drawings, and repeated descriptions thereof are omitted.

Figure 2:
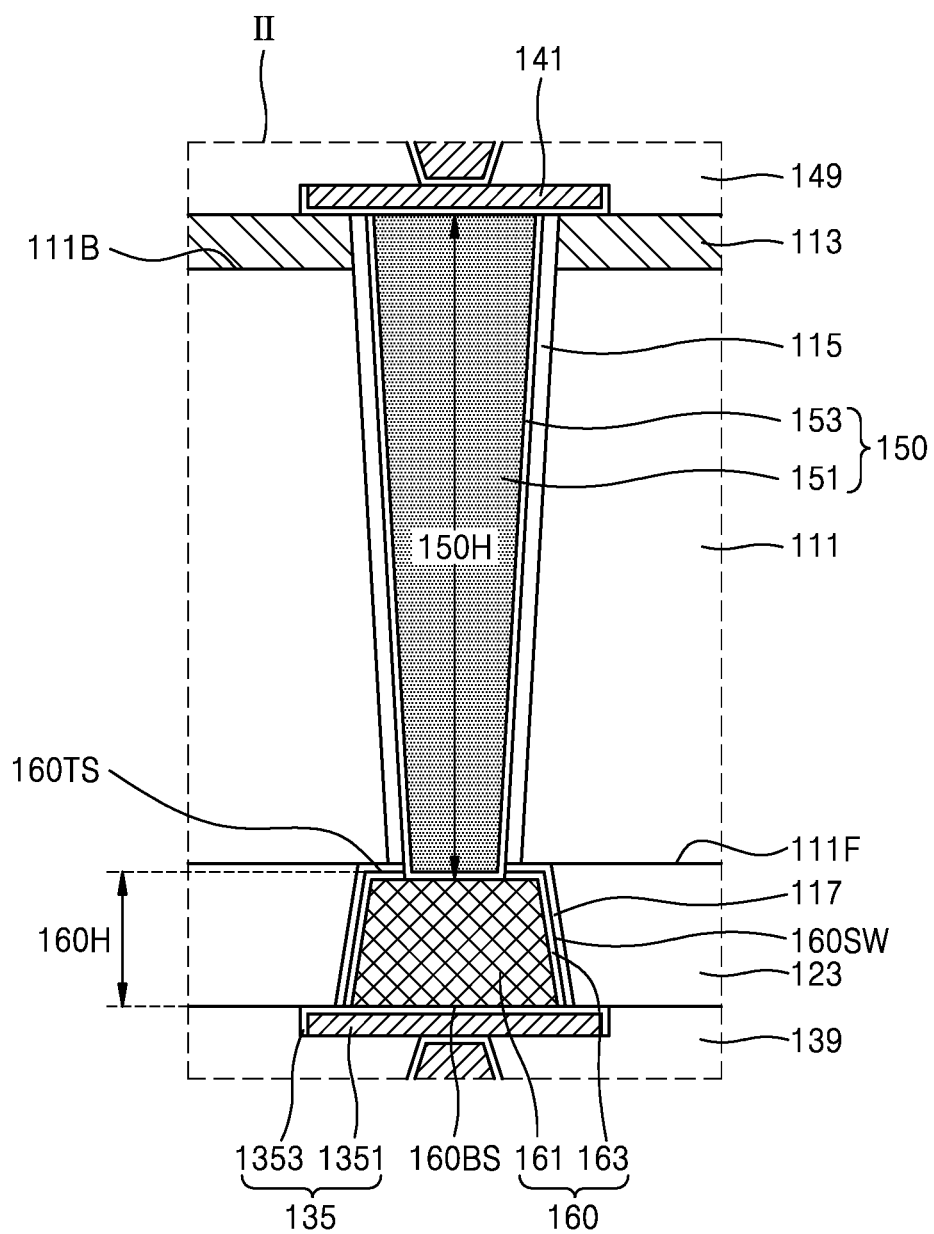
FIG. 2 is an enlarged cross-sectional view of a region indicated by "II" in FIG. 1.

FIG. 1 is a cross-sectional view illustrating an integrated circuit (IC) device 100 according to example embodiments of the inventive concept. FIG. 2 is an enlarged cross-sectional view of a region indicated by "II" in FIG. 1.

Referring to FIGS. 1 and 2, the IC device 100 includes a first semiconductor substrate 111, a front end of line (FEOL) structure 120, a first interconnect structure 130, a second interconnect structure 140, a through-electrode 150, an electrode landing pad 160, and a pad insulating layer 117.

The first semiconductor substrate 111 may include a first surface 111F and a second surface 111B opposite to each other. The first surface 111F of the first semiconductor substrate 111 may be a front-side surface of the first semiconductor substrate 111, and the second surface 111B of the first semiconductor substrate 111 may be a backside surface of the first semiconductor substrate 111. The first surface 111F of the first semiconductor substrate 111 may be an active surface of the first semiconductor substrate 111, and the second surface 111B of the first semiconductor substrate 111 may be an inactive surface of the first semiconductor substrate 111. The first surface 111F may face the FEOL structure 120, and the second surface 111B may face the second interconnect structure 140.

Hereinafter, a direction parallel to the second surface 111B of the first semiconductor substrate 111 is defined as a horizontal direction (e.g., an X-direction and/or a Y-direction), and a direction perpendicular to the second surface 111B of the first semiconductor substrate 111 is defined as a vertical direction (e.g., a Z-direction). In addition, a horizontal width of a certain member refers to a length in a horizontal direction (e.g., the X-direction and/or the Y-direction), and a vertical height of a certain member refers to a length in a vertical direction (e.g., the Z-direction). As used herein, the term "thickness" may refer to a thickness or height in the vertical direction.

A thickness of the first semiconductor substrate 111 (i.e., a distance between the first surface 111F and the second surface 111B of the first semiconductor substrate 111 in the vertical direction (e.g., the Z-direction)) may be about 300 nanometers (nm) to about 800 nm.

A passivation layer 113 may be formed on the second surface 111B of the first semiconductor substrate 111. The passivation layer 113 may cover the second surface 111B of the first semiconductor substrate 111. For example, a thickness of the passivation layer 113 may be about 50 nm to about 300 nm. The passivation layer 113 may contact the second surface 111B of the first semiconductor substrate 111. As used herein, the term "contact" refers to a direct connection (i.e., touching) unless the context indicates otherwise.

The first semiconductor substrate 111 may be formed from a semiconductor wafer. The first semiconductor substrate 111 may include, for example, silicon (Si). Alternatively, the first semiconductor substrate 111 may include a semiconductor element such as germanium (Ge) or a compound semiconductor such as silicon carbide (SiC), gallium arsenide (GaAs), indium arsenide (InAs), and indium phosphide (InP). The first semiconductor substrate 111 may include a conductive region, for example, a well doped with impurities or a structure doped with impurities. Also, the first semiconductor substrate 111 may have various device isolation structures such as a shallow trench isolation (STI) structure.

The FEOL structure 120 may be provided on the first surface 111F of the first semiconductor substrate 111. The FEOL structure 120 may include a first insulating layer 123 and various types of individual devices 121. The individual devices 121 may be provided in the first semiconductor substrate 111 or may be provided on the first surface 111F of the first semiconductor substrate 111. The individual devices 121 may include, for example, a transistor. The individual devices 121 may include microelectronic devices, for example, an image sensor such as a metal-oxide-semiconductor field effect transistor (MOSFET), a system large scale integration (LSI), a CMOS imaging sensor (CIS), etc., a micro-electro-mechanical system (MEMS), an active device, a passive device, and the like. The individual devices 121 may be electrically connected to a conductive region of the first semiconductor substrate 111. The individual devices 121 may be electrically isolated from other neighboring individual devices 121 by a first insulating layer 123.

The first insulating layer 123 may be provided on the first surface 111F of the first semiconductor substrate 111. The first insulating layer 123 may cover the first surface 111F of the first semiconductor substrate 111. The first insulating layer 123 may contact the first surface 111F of the first semiconductor substrate 111. The first insulating layer 123 may include a plurality of interlayer insulating layers sequentially stacked on the first surface 111F of the first semiconductor substrate 111. In example embodiments, the first insulating layer 123 may include an oxide and/or a nitride. For example, the first insulating layer 123 may include silicon oxide and/or silicon nitride. In example embodiments, the first insulating layer 123 may include an insulating material including a photo imageable dielectric (PID) material available for a photolithography process. For example, the first insulating layer 123 may include photosensitive polyimide (PSPI).

The first interconnect structure 130 may be provided on the first insulating layer 123 of the FEOL structure 120. The first interconnect structure 130 may be connected to a bottom surface of the first insulating layer 123 of the FEOL structure 120. The first interconnect structure 130 may include a back end of line (BEOL) structure formed on the FEOL structure 120. A footprint of the first interconnect structure 130 may be the same as those of the FEOL structure 120 and the first semiconductor substrate 111. The first interconnect structure 130 may include a first conductive wiring pattern 138 and a first wiring insulating layer 139. The first conductive wiring pattern 138 of the first interconnect structure 130 may include a plurality of first conductive lines 131, a plurality of first conductive vias 133, and a plurality of conductive pads 135.

The first conductive lines 131 may be covered by the first wiring insulating layer 139. Each of the first conductive lines 131 may extend in a horizontal direction (e.g., the X-direction and/or the Y-direction) within the first wiring insulating layer 139. The first conductive lines 131 may be positioned on different levels in the vertical direction (e.g., the Z-direction) within the first wiring insulating layer 139 to form a multilayer interconnect structure. In FIG. 1, the first conductive lines 131 are illustrated as having a three-layer structure, but this is only an example, and the first conductive lines 131 may be formed to have a two-layer structure or a structure of four or more layers.

The first conductive vias 133 extend between the first conductive lines 131 located on different vertical levels to electrically connect the first conductive lines 131 located on different vertical levels. For example, a first conductive via 133 may contact a first conductive line 131 on a first vertical level and extend in the vertical direction to contact another first conductive line 131 on a second vertical level.

A conductive line closest to the first insulating layer 123 among the first conductive lines 131 may be connected to a conductive contact plug 137. The conductive contact plugs 137 may electrically connect some of the first conductive lines 131 to the individual devices 121 included in the FEOL structure 120 or may electrically connect some of the first conductive lines 131 to the conductive region of the first semiconductor substrate 111.

In example embodiments, a horizontal width of each of the first conductive vias 133 may gradually decrease toward the first surface 111F of the first semiconductor substrate 111. For example, each of the first conductive vias 133 may have a tapered shape with a horizontal width narrowing toward the first surface 111F of the first semiconductor substrate 111.

For example, the first conductive lines 131, the first conductive vias 133, and the conductive contact plugs 137 may include metals such as copper (Cu), aluminum (Al), tungsten (W), and titanium. (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or alloys thereof.

The first wiring insulating layer 139 may include a plurality of interlayer insulating layers sequentially stacked on the first insulating layer 123. In example embodiments, the first wiring insulating layer 139 may include an oxide and/or a nitride. For example, the first wiring insulating layer 139 may include silicon oxide and/or silicon nitride. In example embodiments, the first wiring insulating layer 139 may include an insulating material of a photoimageable dielectrics (PID) material available for a photolithography process. For example, the first wiring insulating layer 139 may include photosensitive polyimide (PSPI).

The second interconnect structure 140 may be provided on the second surface 111B of the first semiconductor substrate 111. The second interconnect structure 140 may include a BEOL structure. A footprint of the second interconnect structure 140 may be equal to that of the first semiconductor substrate 111. The second interconnect structure 140 may include a second conductive wiring pattern 148 and a second wiring insulating layer 149. The second conductive wiring pattern 148 of the second interconnect structure 140 may include a plurality of second conductive lines 141 and a plurality of second conductive vias 143.

The second conductive lines 141 may be covered by the second wiring insulating layer 149. Each of the second conductive lines 141 may extend in a horizontal direction (e.g., the X-direction and/or the Y-direction) within the second wiring insulating layer 149. The second conductive lines 141 may be positioned on different levels in the vertical direction (e.g., the Z-direction) within the second wiring insulating layer 149 to form a multilayer interconnect structure. In FIG. 1, the second conductive lines 141 are illustrated as having a three-layer structure, but this is only an example, and the second conductive lines 141 may be formed to have a two-layer structure or a structure of four or more layers. Some of the second conductive lines 141 may constitute an electrode pad in contact with the through-electrode 150. Also, some of the second conductive lines 141 may constitute a bump pad connected to a connection bump (see, e.g., connection bumps 190 of FIG. 8).

The second conductive vias 143 may extend between the second conductive lines 141 located on different vertical levels to electrically connect the second conductive lines 141 located on different vertical levels. For example, a second conductive via 143 may contact a second conductive line 141 on a first vertical level and extend in the vertical direction to contact another second conductive line 141 on a second vertical level.

In example embodiments, a horizontal width of each of the second conductive vias 143 may gradually decrease toward the second surface 111B of the first semiconductor substrate 111. For example, each of the second conductive vias 143 may have a tapered shape with a horizontal width narrowing toward the second surface 111B of the first semiconductor substrate 111.

The second conductive lines 141 and the second conductive vias 143 may include metals such as copper (Cu), aluminum (Al), tungsten (W), titanium (Ti), and tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or alloys thereof.

The second wiring insulating layer 149 may include a plurality of interlayer insulating layers sequentially stacked on the second surface 111B of the first semiconductor substrate 111. In example embodiments, the second wiring insulating layer 149 may include an oxide and/or a nitride. For example, the second wiring insulating layer 149 may include silicon oxide and/or silicon nitride. In example embodiments, the second wiring insulating layer 149 may include an insulating material of a PID material available for a photolithography process. For example, the second wiring insulating layer 149 may include PSPI.

The through-electrode 150 may electrically connect the first conductive wiring pattern 138 of the first interconnect structure 130 to the second conductive wiring pattern 148 of the second interconnect structure 140. The through-electrode 150 may penetrate through the passivation layer 113 and the first semiconductor substrate 111. The through-electrode 150 may be provided in a through-hole (e.g., through-hole 111TH in FIG. 12G) formed in the first semiconductor substrate 111 and may extend from the second surface 111B to the first surface 111F of the first semiconductor substrate 111. A via insulating layer 115 may be interposed between the through-electrode 150 and a sidewall of the first semiconductor substrate 111 defining the through-hole 111TH. The via insulating layer 115 may include, for example, a high aspect ratio process (HARP) oxide film based on ozone/tetra-ethyl ortho-silicate ($O_3$/TEOS) formed by a sub-atmospheric chemical vapor deposition (CVD) process.

The through-electrode 150 may include a pillar-shaped conductive plug 151 and a first conductive barrier layer 153 positioned on an outer surface of the conductive plug 151.

The first conductive barrier layer 153 may surround a sidewall of the conductive plug 151 and cover a bottom surface of the conductive plug 151. For example, the first conductive barrier layer 153 may contact the sidewall and the bottom surface of the conductive plug 151. The conductive plug 151 may include at least one selected from among copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru). The first conductive barrier layer 153 may include at least one selected from among titanium (Ti), titanium nitride (TiN), tantalum (Ta), tantalum nitride (TaN), tungsten (W), tungsten nitride (WN), ruthenium (Ru), and cobalt (Co). The conductive plug 151 and the first conductive barrier layer 153 may be formed by, for example, a physical vapor deposition (PVD) processor or a CVD process.

In example embodiments, a vertical height 150H of the through-electrode 150 may be between about 350 nm and about 1200 nm. In example embodiments, a horizontal width of the through-electrode 150 may be between about 50 nm and about 250 nm.

In example embodiments, an aspect ratio of the through-electrode 150, that is, a ratio of the vertical height 150H of the through-electrode 150 to the horizontal width of the through-electrode 150, may be between about 4 and about 7.

In example embodiments, the horizontal width of the through-electrode 150 may gradually decrease toward the first surface 111F of the first semiconductor substrate 111. For example, the through-electrode 150 may have a tapered shape with a horizontal width narrowing in a direction from the second surface 111B to the first surface 111F of the first semiconductor substrate 111. In this case, a sidewall of the through-electrode 150 may have a profile inclined with respect to the vertical direction (e.g., the Z-direction).

In other example embodiments, the through-electrode 150 may extend with a substantially uniform width, and a width of a top surface of the through-electrode 150 may be substantially equal to a width of a bottom surface of the through-electrode 150. In this case, a sidewall of the through-electrode 150 may have a profile substantially parallel to the vertical direction (e.g., the Z-direction).

The electrode landing pad 160 may be provided on the first surface 111F of the first semiconductor substrate 111. The electrode landing pad 160 may be aligned with the through-electrode 150 in a vertical direction (e.g., the Z-direction). The electrode landing pad 160 may be physically and electrically connected to the through-electrode 150. The electrode landing pad 160 may electrically connect the through-electrode 150 to the first conductive wiring pattern 138 of the first interconnect structure 130. The electrode landing pad 160 may be buried in a recess (see, e.g., recess 123H of FIG. 12A) formed in the first insulating layer 123. For example, the electrode landing pad 160 may have a pillar shape extending in a thickness direction (e.g., the vertical direction) of the first insulating layer 123. The electrode landing pad 160 may include a top surface 160TS facing the first surface 111F of the first semiconductor substrate 111, a bottom surface 160BS opposite to the top surface 160TS, and a sidewall 160SW surrounded by the first insulating layer 123. The top surface 160TS of the electrode landing pad 160 may be parallel to the bottom surface 160BS of the electrode landing pad 160, and the bottom surface 160BS of the electrode landing pad 160 may be coplanar with a bottom surface of the first insulating layer 123. For example, the electrode landing pad 160 may be formed through a damascene process.

The electrode landing pad 160 may include a conductive core layer 161 and a second conductive barrier layer 163 positioned on an outer surface of the conductive core layer 161. The second conductive barrier layer 163 may surround a sidewall of the conductive core layer 161 and cover at least a portion of an upper surface of the conductive core layer 161. For example, the second conductive barrier layer 163 may contact the top surface 160TS of the electrode landing pad 160 and the sidewall 160SW of the electrode landing pad 160. The conductive core layer 161 may include at least one selected from among copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru). The second conductive barrier layer 163 may include at least one selected from among titanium (Ti), titanium nitride (TiN), tantalum (Ta), tantalum nitride (TaN), tungsten (W), tungsten nitride (WN), ruthenium (Ru), and cobalt (Co).

In example embodiments, a vertical height 160H of the electrode landing pad 160 may be at a level similar to that of the first insulating layer 123. In example embodiments, the vertical height 160H of the electrode landing pad 160 may be between about 150 nm and about 500 nm.

In example embodiments, a horizontal width of the electrode landing pad 160 may be equal to or greater than a horizontal width of the through-electrode 150. For example, a horizontal width of the top surface 160TS of the electrode landing pad 160 in contact with the through-electrode 150 may be equal to or greater than a horizontal width of a bottom surface of the through-electrode 150. In example embodiments, the horizontal width of the electrode landing pad 160 may be between about 60 nm and about 300 nm.

In example embodiments, the horizontal width of the electrode landing pad 160 may gradually decrease toward the first surface 111F of the first semiconductor substrate 111. For example, the electrode landing pad 160 may have a tapered shape with a horizontal width narrowing from the bottom surface 160BS to the top surface 160TS. In this case, the sidewall 160SW of the electrode landing pad 160 may have a profile inclined with respect to the vertical direction (e.g., the Z-direction). For example, a contained angle between the sidewall 160SW of the electrode landing pad 160 and the vertical direction (e.g., the Z-direction) may be between about 0.1° and about 10°.

In example embodiments, the first conductive barrier layer 153 of the through-electrode 150 may penetrate through the second conductive barrier layer 163 of the electrode landing pad 160 and may be in direct contact with the conductive core layer 161 of the electrode landing pad 160. In other example embodiments, the first conductive barrier layer 153 of the through-electrode 150 may be in contact with the second conductive barrier layer 163 of the electrode landing pad 160 and may be spaced apart from the conductive core layer 161 with the second conductive barrier layer 163 of the electrode landing pad 160 therebetween.

The first interconnect structure 130 may include a conductive pad 135 in contact with the bottom surface 160BS of the electrode landing pad 160. The conductive pad 135 may be electrically connected to the through-electrode 150 through the electrode landing pad 160. The conductive pad 135 of the first interconnect structure 130 may be positioned on the same vertical level as the conductive line closest to the first insulating layer 123 among the first conductive lines 131. The conductive pad 135 may be formed together with the conductive line closest to the first insulating layer 123, among the first conductive lines 131, through the same metal interconnect process.

The conductive pad 135 may include a conductive layer 1351 and a third conductive barrier layer 1353 positioned on an outer surface of the conductive layer 1351. The third conductive barrier layer 1353 may be formed to cover an upper surface of the conductive layer 1351 facing the electrode landing pad 160 and a sidewall of the conductive layer 1351. For example, the third conductive barrier layer 1353 may contact the upper surface and the sidewall of the conductive layer 1351. The conductive layer 1351 of the conductive pad 135 may include at least one selected from among copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru). The third conductive barrier layer 1353 may include at least one selected from among titanium (Ti), titanium nitride (TiN), tantalum (Ta), tantalum nitride (TaN), tungsten (W), tungsten nitride (WN), ruthenium (Ru), and cobalt (Co).

In example embodiments, a vertical height of the conductive pad 135 may be smaller than a vertical height 160H of the electrode landing pad 160. For example, the vertical height of the conductive pad 135 may be between about 5% and about 50%, between about 10% and about 45%, or between about 15% and about 40% of the vertical height 160H of the electrode landing pad 160.

In example embodiments, a horizontal width of the conductive pad 135 may be greater than a horizontal width of the electrode landing pad 160. For example, the horizontal width of the conductive pad 135 may be between about 110% and about 200%, between about 120% and about 190%, or between about 130% and about 180% of the horizontal width of the bottom surface 160BS of the electrode landing pad 160.

The pad insulating layer 117 may cover a portion of the top surface 160TS and a sidewall 160SW of the electrode landing pad 160. A portion of the pad insulating layer 117 may be positioned between the first surface 111F of the first semiconductor substrate 111 and the top surface 160TS of the electrode landing pad 160 and may be in contact with each of the first surface 111F of the first semiconductor substrate 111 and the top surface 160TS of the electrode landing pad 160. The electrode landing pad 160 may be spaced apart from the first surface 111F of the first semiconductor substrate 111 with a portion of the pad insulating layer 117 therebetween. The electrode landing pad 160 may be electrically separated from the first semiconductor substrate 111 due to the pad insulating layer 117 interposed between the electrode landing pad 160 and the first semiconductor substrate 111. In addition, another portion of the pad insulating layer 117 may be positioned between the sidewall 160SW of the electrode landing pad 160 and the first insulating layer 123. The other portion of the pad insulating layer 117 may extend along the sidewall 160SW of the electrode landing pad 160 and may be in contact with the sidewall 160SW of the electrode landing pad 160 and the conductive pad 135. The pad insulating layer 117 may include oxide and/or nitride. For example, the pad insulating layer 117 may include silicon oxide and/or silicon nitride.

Figure 3:
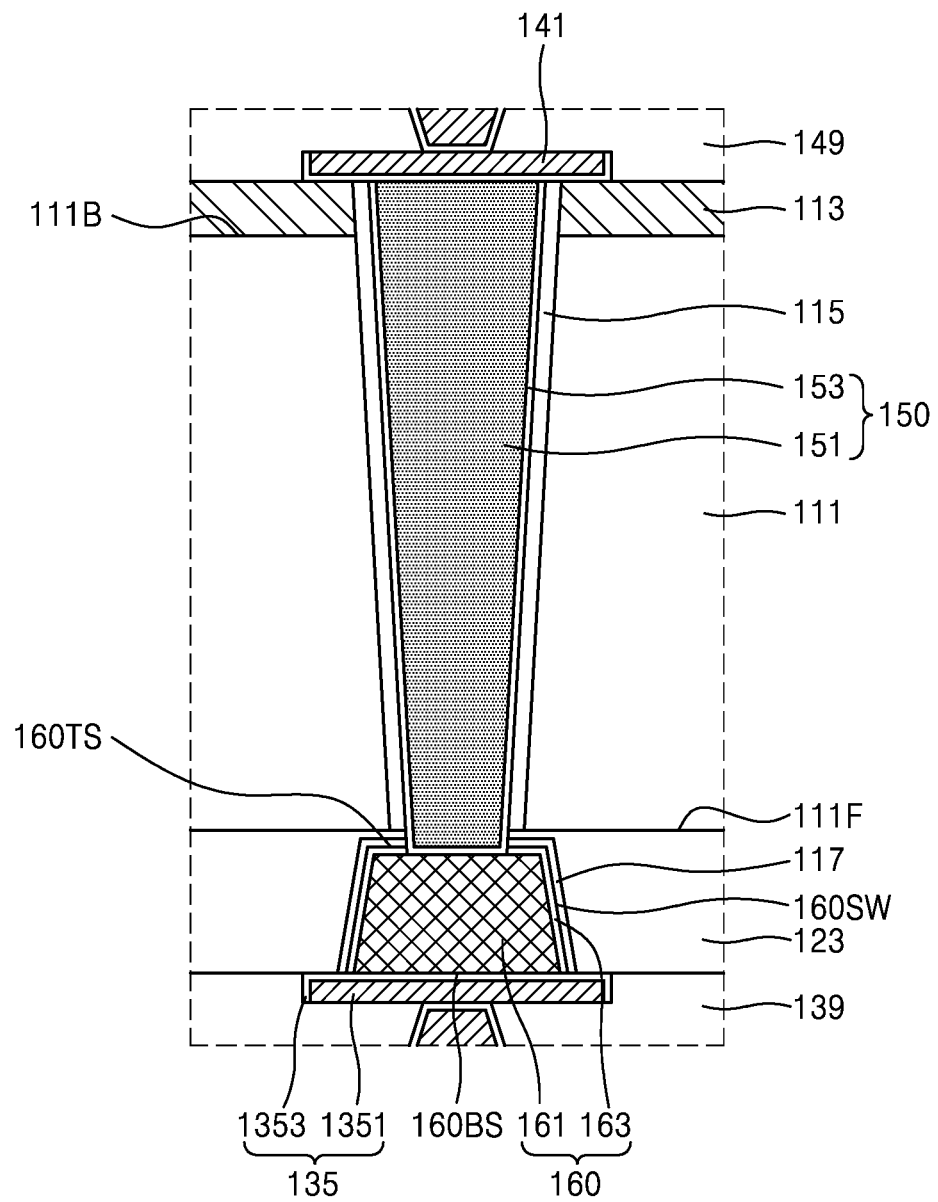
FIG. 3 is a cross-sectional view illustrating a portion of an IC device according to example embodiments of the inventive concept.

FIG. 3 is a cross-sectional view illustrating a portion of an IC device according to example embodiments of the inventive concept. Hereinafter, the IC device shown in FIG. 3 will be described, focusing on differences from the IC device 100 described above with reference to FIGS. 1 and 2.

Referring to FIG. 3, portions of the pad insulating layer 117 and the first insulating layer 123 may be interposed between the top surface 160TS of the electrode landing pad 160 and the first surface 111F of the first semiconductor substrate 111. The pad insulating layer 117 may be spaced apart from the first surface 111F of the first semiconductor substrate 111 with a portion of the first insulating layer 123 therebetween. For example, when a recess (see, e.g., recess 123H of FIG. 12A) is formed in the first insulating layer 123, the recess 123H may be formed to partially penetrate through the first insulating layer 123, and the first surface 111F of the first semiconductor substrate 111 may be covered by the first insulating layer 123 so as not to be exposed through the recess 123H.

In some example embodiments, the pad insulating layer 117 may be omitted, and the electrode landing pad 160 may be in direct contact with the surface of the first insulating layer 123 defining the recess 123H. In this case, electrical insulation between the electrode landing pad 160 and the first semiconductor substrate 111 may be achieved by a portion of the first insulating layer 123 provided between the top surface 160TS of the electrode landing pad 160 and the first surface 111F of the first semiconductor substrate 111.

Figure 4:
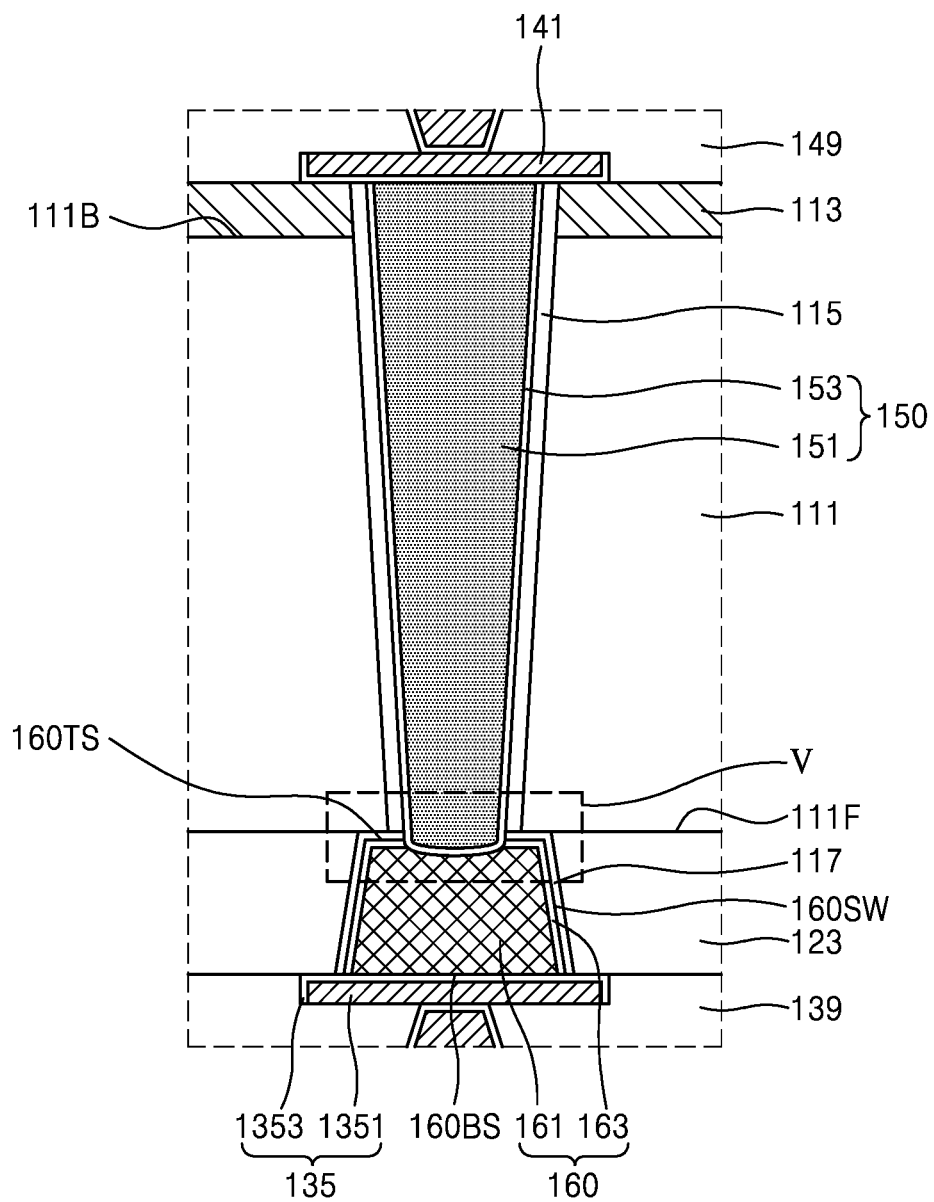
FIG. 4 is a cross-sectional view illustrating a portion of an IC device according to example embodiments of the inventive concept.
Figure 5:
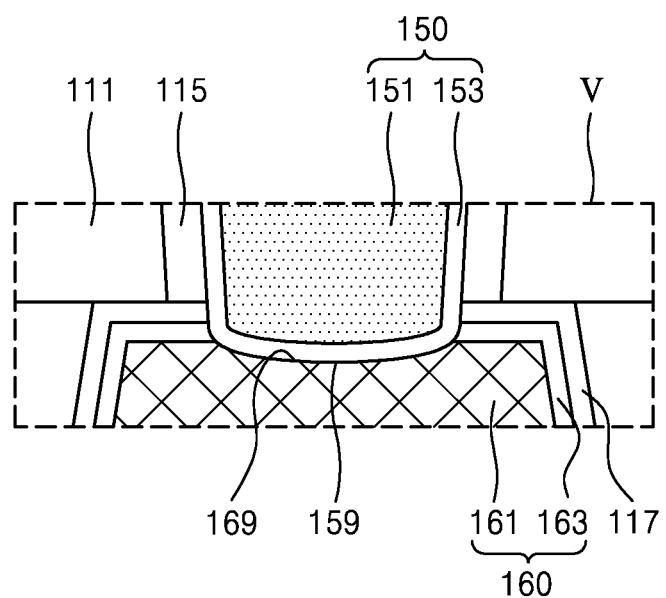
FIG. 5 is an enlarged cross-sectional view of a region indicated by "V" in FIG. 4.

FIG. 4 is a cross-sectional view illustrating a portion of an IC device according to example embodiments of the inventive concept. FIG. 5 is an enlarged cross-sectional view of a region indicated by "V" in FIG. 4. Hereinafter, the IC device shown in FIGS. 4 and 5 will be described, focusing on differences from the IC device 100 described above with reference to FIGS. 1 and 2.

Referring to FIGS. 4 and 5, the top surface 160TS of the electrode landing pad 160 may include a concave surface portion 169, and the bottom surface of the through-electrode 150 may include a convex surface portion 159 in contact with the concave surface portion 169 of the electrode landing pad 160. For example, the convex surface portion 159 of the bottom surface of the through-electrode 150 may be defined by a bottom surface of the first conductive barrier layer 153 formed to cover a bottom surface of the conductive plug 151. For example, the concave surface portion 169 of the top surface 160TS of the electrode landing pad 160 may be defined by an upper surface of the conductive core layer 161. As the concave surface portion 169 of the top surface 160TS of the electrode landing pad 160 is in contact with the convex surface portion 159 of the bottom surface of the through-electrode 150, a contact area between the through-electrode 150 and the electrode landing pad 160 may increase. Accordingly, contact resistance between the through-electrode 150 and the electrode landing pad 160 is reduced, and thus, reliability of an electrical connection between the through-electrode 150 and the electrode landing pad 160 may be improved.

Figure 6:
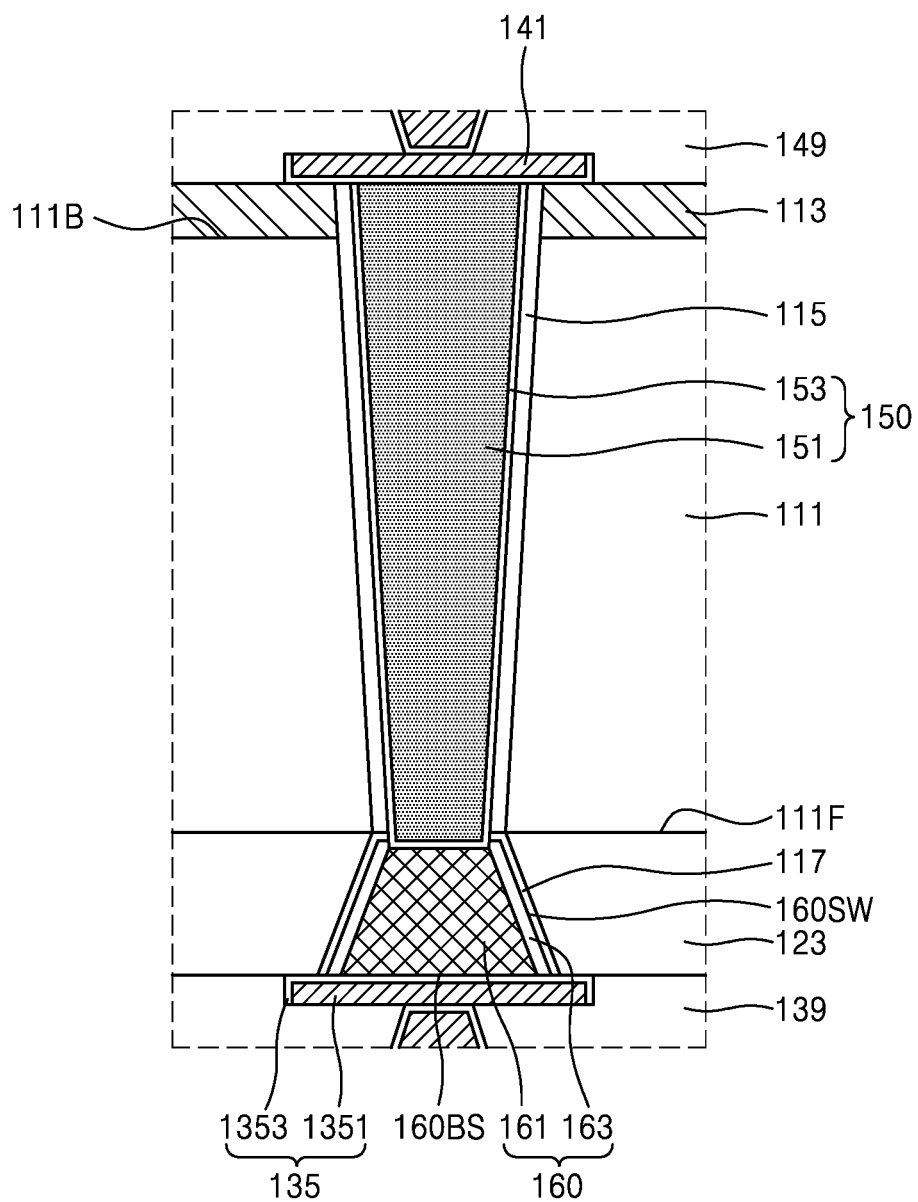
FIG. 6 is a cross-sectional view illustrating a portion of an IC device according to example embodiments of the inventive concept.

FIG. 6 is a cross-sectional view illustrating a portion of an IC device according to example embodiments of the inventive concept. Hereinafter, the IC device shown in FIG. 6 will be described, focusing on differences from the IC device 100 described above with reference to FIGS. 1 and 2.

Referring to FIG. 6, the electrode landing pad 160 may have a tapered shape with a horizontal width narrowing toward the first surface 111F of the first semiconductor substrate 111. Here, a width of an upper surface of the electrode landing pad 160 may be substantially similar to a width of the bottom surface of the through-electrode 150. For example, the width of the upper surface of the electrode landing pad 160 may be between about 100% and about 110% of the width of the bottom surface of the through-electrode 150.

As shown in FIG. 6, the pad insulating layer 117 surrounding the electrode landing pad 160 may be in contact with the first surface 111F of the first semiconductor substrate 111. Alternatively, in other example embodiments, the pad insulating layer 117 surrounding the electrode landing pad 160 may be spaced apart from the first surface 111F of the first semiconductor substrate 111.

Figure 7:
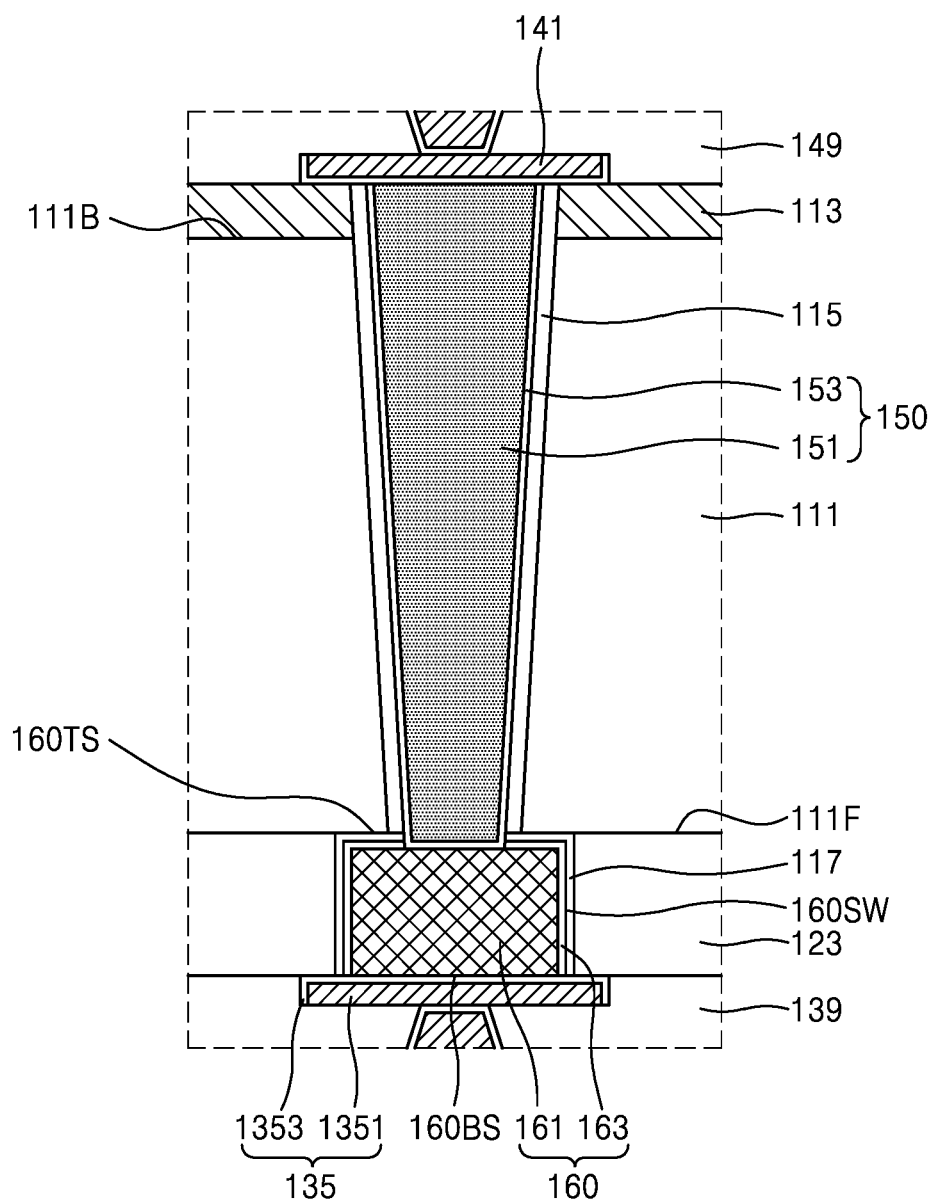
FIG. 7 is a cross-sectional view illustrating a portion of an IC device according to example embodiments of the inventive concept.

FIG. 7 is a cross-sectional view illustrating a portion of an IC device according to example embodiments of the inventive concept. Hereinafter, the IC device shown in FIG. 7 will be described, focusing on differences from the IC device 100 described above with reference to FIGS. 1 and 2.

Referring to FIG. 7, the electrode landing pad 160 may extend with a substantially uniform width, and the width of the top surface 160TS of the electrode landing pad 160 may be substantially equal to the width of the bottom surface 160BS of the electrode landing pad 160. In this case, the sidewall 160SW of the electrode landing pad 160 may have a profile substantially parallel to the vertical direction (e.g., the Z-direction).

As shown in FIG. 7, the pad insulating layer 117 surrounding the electrode landing pad 160 may be in contact with the first surface 111F of the first semiconductor substrate 111. Alternatively, in other example embodiments, the pad insulating layer 117 surrounding the electrode landing pad 160 may be spaced apart from the first surface 111F of the first semiconductor substrate 111.

Figure 8:
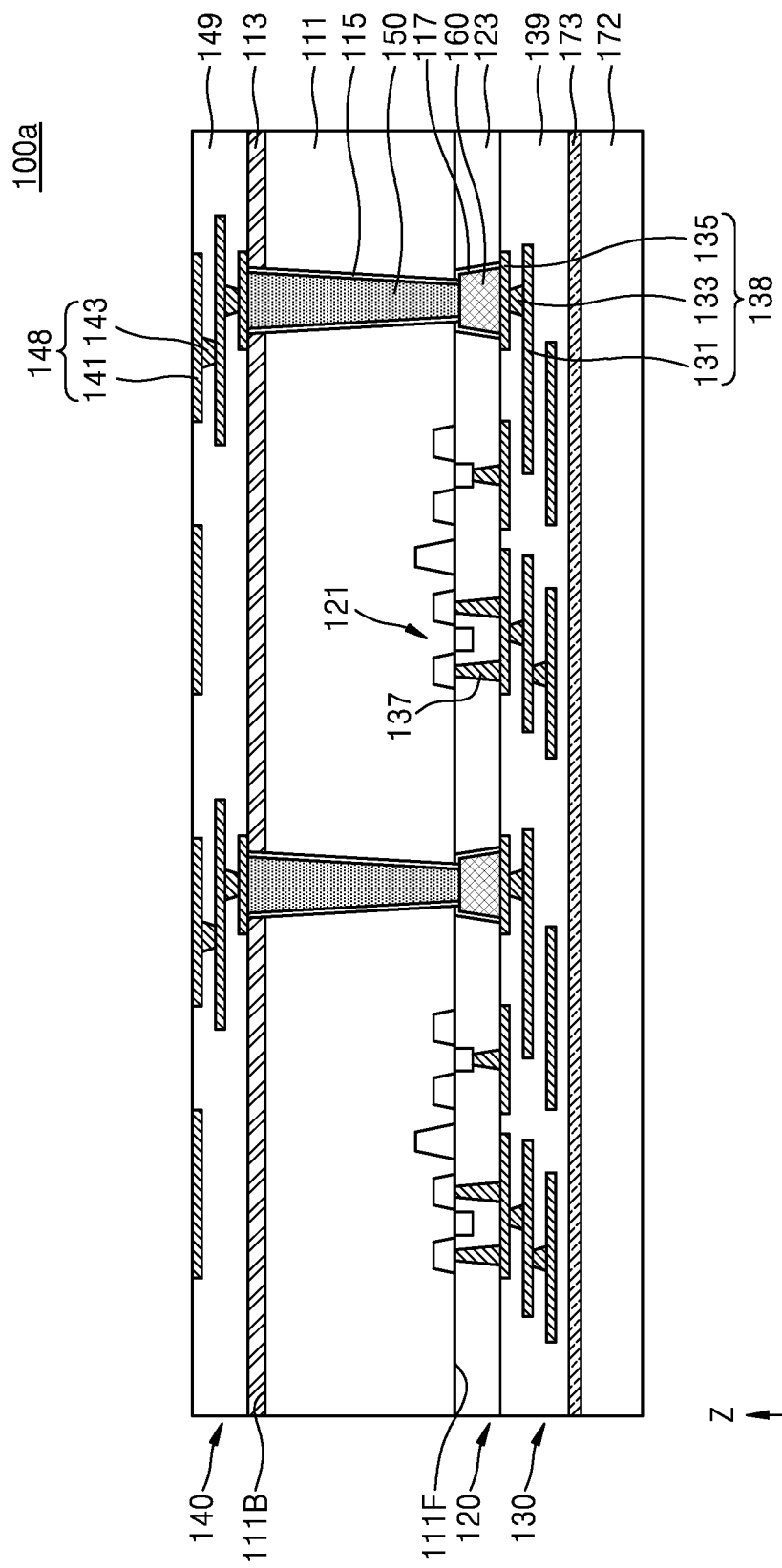
FIG. 8 is a cross-sectional view illustrating a portion of an IC device according to example embodiments of the inventive concept.

FIG. 8 is a cross-sectional view illustrating a portion of an IC device 100a according to example embodiments of the inventive concept. Hereinafter, the IC device 100a shown in FIG. 8 will be described, focusing on differences from the IC device 100 described above with reference to FIGS. 1 and 2.

Referring to FIG. 8, the IC device 100a may further include a cover substrate 172 attached to the first interconnect structure 130. The cover substrate 172 may cover a lower surface of the first interconnect structure 130. An adhesive material layer 173 for fixing the cover substrate 172 to the first interconnect structure 130 may be provided between the cover substrate 172 and the first interconnect structure 130. The cover substrate 172 may be, for example, a semiconductor substrate. For example, the cover substrate 172 may be formed from a semiconductor wafer and may include silicon (Si).

Figure 9:
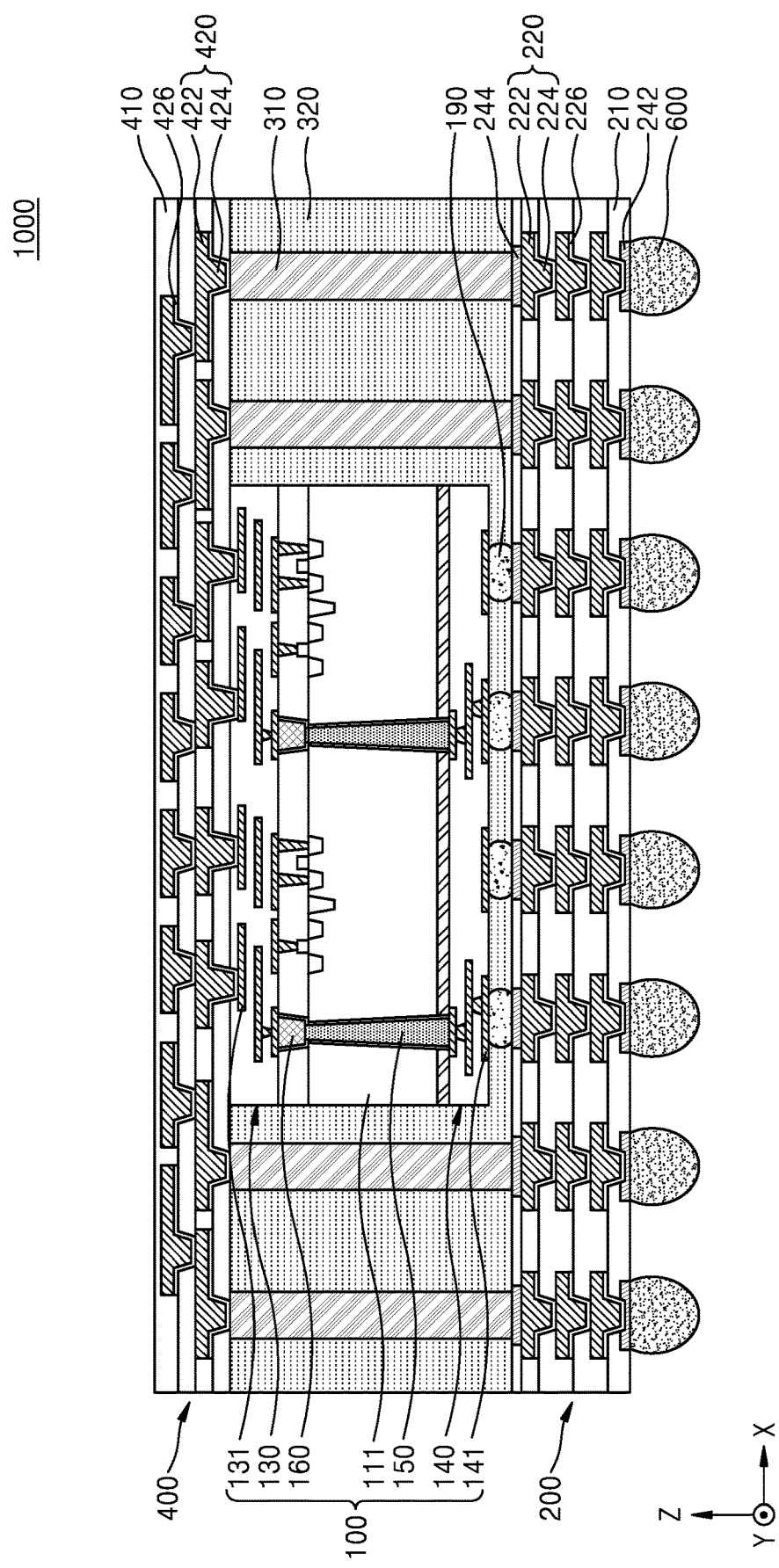
FIG. 9 is a cross-sectional view illustrating a semiconductor package according to example embodiments of the inventive concept.

FIG. 9 is a cross-sectional view illustrating a semiconductor package 1000 according to example embodiments of the inventive concept.

Referring to FIG. 9 together with FIGS. 1 and 2, the semiconductor package 1000 may include a first redistribution structure 200, an IC device 100, a first molding layer 320, a conductive post 310, and a second redistribution structure 400.

The first redistribution structure 200 may be a package substrate on which the IC device 100 is mounted. In example embodiments, the first redistribution structure 200 may be a redistribution substrate manufactured through a redistribution process. For example, the first redistribution structure 200 may include a first conductive redistribution pattern 220 and a plurality of first redistribution insulating layers 210 covering the first conductive redistribution pattern 220. In other example embodiments, the first redistribution structure 200 may be a printed circuit board.

The first redistribution insulating layers 210 may be stacked on each other in a vertical direction (e.g., the Z-direction). The first redistribution insulating layers 210 may be formed from a material layer including an organic compound. For example, each of the first redistribution insulating layers 210 may be formed from PID or PSPI.

The first conductive redistribution pattern 220 may include a plurality of first redistribution lines 222 positioned on at least one of upper and lower surfaces of each of the first redistribution insulating layers 210, and a plurality of first redistribution vias 224 extending through at least one of the first redistribution insulating layers 210. The first redistribution vias 224 may electrically connect the first redistribution lines 222 positioned on different levels in a vertical direction (e.g., the Z-direction). For example, the first conductive redistribution pattern 220 may include metals such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or alloys thereof. A first redistribution seed layer 226 may be interposed between the first conductive redistribution pattern 220 and the first redistribution insulating layers 210.

In example embodiments, the first redistribution structure 200 may further include a plurality of external connection pads 242 provided therebelow. An external connection terminal 600 may be attached to each of the external connection pads 242. Each of the external connection pads 242 may electrically connect the external connection terminal 600 to the first conductive redistribution pattern 220. In addition, the first redistribution structure 200 may further include a plurality of connection pads 244 provided on an upper side thereof. Some of the connection pads 244 may be connected to the conductive post 310, and the others of the connection pads 244 may be connected to the connection bumps 190.

The IC device 100 may be mounted on the first redistribution structure 200. The IC device 100 may be mounted on the first redistribution structure 200 in a flip-chip manner through connection bumps 190. The connection bumps 190 may be, for example, micro bumps. In FIG. 9, the IC device 100 is illustrated as corresponding to the IC device described above with reference to FIGS. 1 and 2, but the semiconductor package 1000 may include the IC device described above with reference to FIGS. 2 to 7 or the IC device 100a described above with reference to FIG. 8.

In example embodiments, the IC device 100 may be a logic semiconductor device. For example, the IC device 100 may be a central processing unit (CPU) chip, a graphics processing unit (GPU) chip, or an application processor (AP) chip. In this disclosure, a logic semiconductor chip is not a memory semiconductor chip, but refers to a semiconductor chip that performs logical operations. For example, a logic semiconductor chip may include a logic cell. The logic cell may include a plurality of circuit elements such as transistors and resistors, and may be configured to vary. The logic cell may configure, for example, AND, NAND, OR, NOR, XOR (exclusive OR), XNOR (exclusive NOR), INV (inverter), ADD (adder), BUF (buffer), DLY (delay), FIL (filter), multiplexer (MXT/MXIT), OAI (OR/AND/INVERTER), AO (AND/OR), AOI (AND/OR/INVERTER), D flip-flop, reset flip-flop, master-slaver flip-flop, latch, and the like, and the logic cell may configure standard cells that perform desired logical functions such as counters and buffers.

In example embodiments, the IC device 100 may be a memory semiconductor chip. For example, the IC device 100 may include a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The first molding layer 320 may be provided on the first redistribution structure 200 and may cover at least a portion of the IC device 100 and at least a portion of the conductive post 310. For example, the first molding layer 320 may extend along a sidewall of the IC device 100. For example, the first molding layer 320 may extend along a sidewall of the first interconnect structure 130, a sidewall of the FEOL structure 120, a sidewall of the first semiconductor substrate 111, and a sidewall of the second interconnect structure 140. In example embodiments, the first molding layer 320 may include an insulating polymer or an epoxy resin. For example, the first molding layer 320 may include an epoxy mold compound (EMC). In example embodiments, a level of an upper surface of the first molding layer 320 may be equal to or higher than a level of an upper surface of the IC device 100.

The conductive posts 310 may be positioned to be spaced apart from a sidewall of the IC device 100 in a horizontal direction (e.g., the X-direction and/or the Y-direction). The conductive post 310 may be a through mold via extending in a vertical direction (e.g., the Z-direction) in the first molding layer 320. The conductive post 310 may include, for example, copper (Cu).

The conductive post 310 may be a vertical connection conductor for electrically connecting the first conductive redistribution pattern 220 of the first redistribution structure 200 to the second conductive redistribution pattern 420 of the second redistribution structure 400. A lower end of the conductive post 310 may be connected to the connection pad 244 of the first redistribution structure 200, and an upper end of the conductive post 310 may be connected to a portion of the second conductive redistribution pattern 420. A level of the conductive post 310 in a vertical direction (e.g., the Z-direction) of the upper end of the conductive post 310 may be the same as or higher than a level of the upper surface of the IC device 100. Upper surfaces of the conductive posts 310 may be coplanar with an upper surface of the first molding layer 320, and lower surfaces of the conductive posts 310 may be coplanar with a lower surface of the first molding layer 320.

The second redistribution structure 400 may be positioned on the first molding layer 320 and the IC device 100. The second redistribution structure 400 may be formed to cover the upper surface of the IC device 100 and the upper surface of the first molding layer 320. A footprint of the second redistribution structure 400 may be larger than that of the IC device 100 and may be the same as a footprint of the first redistribution structure 200. The footprint of the second redistribution structure 400 and the footprint of the first redistribution structure 200 may be the same as the footprint of the semiconductor package 1000.

The second redistribution structure 400 may include a second conductive redistribution pattern 420 and a plurality of second redistribution insulating layers 410 covering the second conductive redistribution pattern 420.

The second redistribution insulating layers 410 may be stacked on each other in a vertical direction (e.g., the Z-direction). The second redistribution insulating layers 410 may be formed from a material layer including an organic compound. For example, each of the second redistribution insulating layers 410 may be formed from PID or PSPI.

The second conductive redistribution pattern 420 may include a plurality of second redistribution lines 422 positioned on at least one of upper and lower surfaces of each of the second redistribution insulating layers 410 and a plurality of second redistribution vias 424 extending through at least one of the second redistribution insulating layers 410. The second redistribution vias 424 may electrically connect the second redistribution lines 422 positioned on different levels in a vertical direction (e.g., the Z-direction). For example, the second conductive redistribution pattern 420 may include metals such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or alloys thereof. A second redistribution seed layer 426 may be interposed between the second conductive redistribution pattern 420 and the second redistribution insulating layers 410. At least some of the second redistribution lines 422 may be formed together with some of the second redistribution vias 424 to form an integral body. For example, some of the second redistribution lines 422 may be formed together to form one body with the second redistribution via 424 in contact with a lower surface thereof. Some of the second redistribution lines 422 may penetrate through the lowermost one of the second redistribution insulating layers 410 and may be connected to the upper end of the conductive post 310.

In example embodiments, each of the first redistribution vias 224 may have a tapered shape extending with a horizontal width narrowing from an upper side thereof toward a lower side thereof. For example, the horizontal width of each of the first redistribution vias 224 may gradually decrease away from the IC device 100.

In example embodiments, each of the second redistribution vias 424 may have a tapered shape extending with a horizontal width narrowing from an upper side thereof toward a lower side thereof. For example, the horizontal width of each of the second redistribution vias 424 may gradually decrease as toward the IC device 100.

In example embodiments, an inclination of the sidewall of the second redistribution via 424 measured based on a vertical direction (e.g., the Z-direction) may be greater than an inclination of the sidewall of the second conductive via 143 of the second interconnect structure 140 measured based on a vertical direction (e.g., the Z-direction). In example embodiments, a first contained angle between the sidewall of the second redistribution via 424 and the vertical direction (e.g., the Z-direction) may be greater than a second contained angle between the sidewall of the second conductive via 143 and the vertical direction (e.g., the Z direction). For example, the first contained angle may be between about 10° and about 30°, and the second contained angle may be between about 0.1° and about 10°.

In example embodiments, the second interconnect structure 140 may constitute a power distribution network. The IC device 100 may be configured to receive external power through the second interconnect structure 140 positioned to face the first redistribution structure 200. For example, a power signal (e.g., a driving voltage and a ground voltage) provided from an external device may be transmitted to the individual devices 121 of the IC device 100 through a power transmission path that includes the external connection terminal 600, the first conductive redistribution pattern 220 of the first redistribution structure 200, the connection bump 190, the second conductive wiring pattern 148 of the second interconnect structure 140, the through-electrode 150, and the electrode landing pad 160.

In example embodiments, the IC device 100 may be configured to transmit and receive signals, excluding power such as a data signal and a control signal, through the first interconnect structure 130. For example, between the external device and the IC device 100, the data signal and the control signal may be transmitted through a signal transmission path that includes the external connection terminal 600, the first conductive redistribution pattern 220 of the first redistribution structure 200, the conductive post 310, the second conductive redistribution pattern 420 of the second redistribution structure 400, and the first conductive wiring pattern 138 of the first interconnect structure 130.

Figure 10:
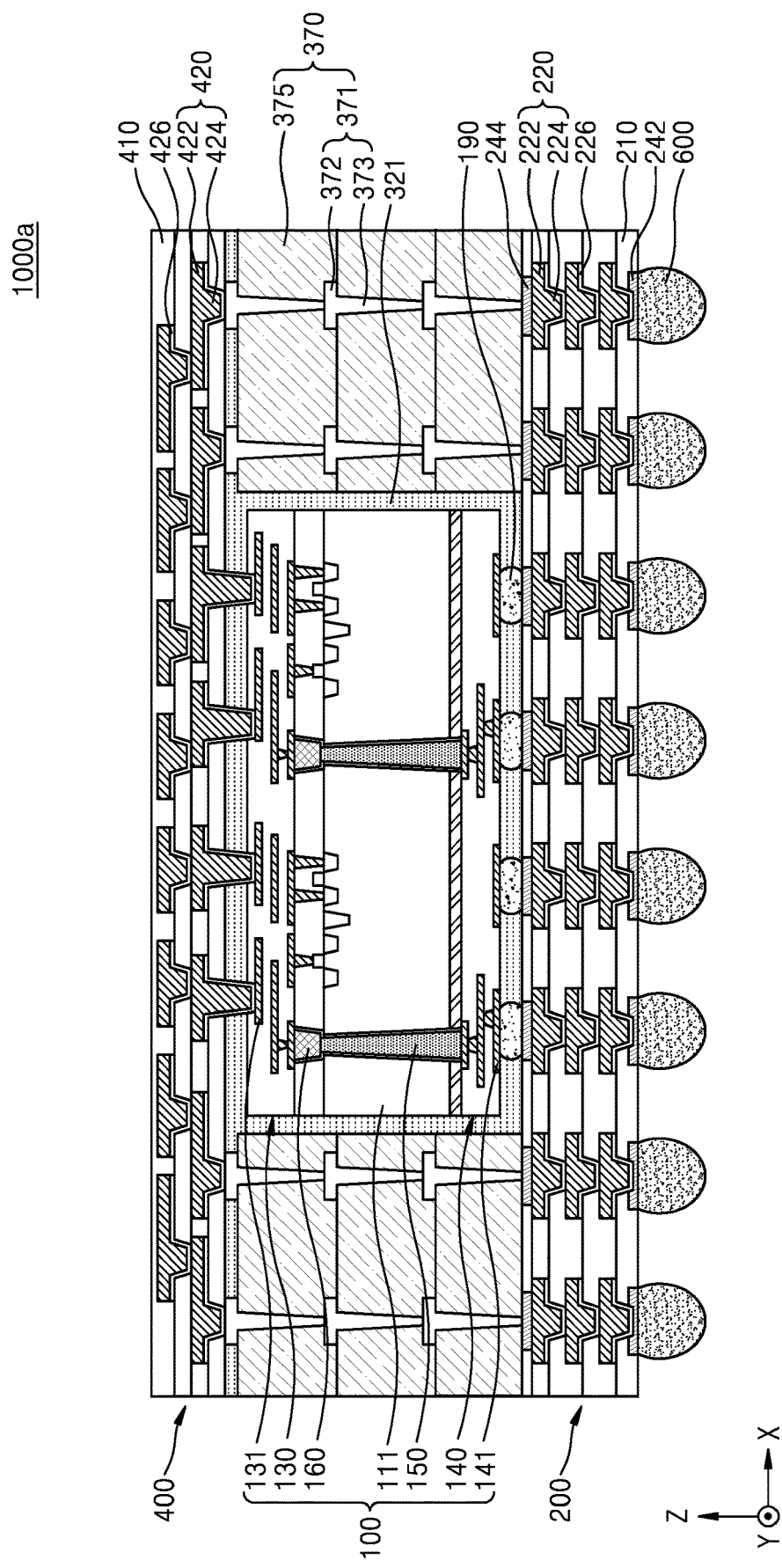
FIG. 10 is a cross-sectional view illustrating a semiconductor package according to example embodiments of the inventive concept.

FIG. 10 is a cross-sectional view illustrating a semiconductor package 1000a according to example embodiments of the inventive concept. Hereinafter, the semiconductor package 1000a shown in FIG. 10 will be described, focusing on differences from the semiconductor package 1000 described above with reference to FIG. 9.

Referring to FIG. 10 together with FIGS. 1 and 2, the semiconductor package 1000a may include a first redistribution structure 200, an IC device 100, an extension layer 370, a first molding layer 321, and a second redistribution structure 400.

The extension layer 370 may be positioned on the first redistribution structure 200 and may include a mounting space for accommodating the IC device 100. In example embodiments, the extension layer 370 may include a panel board. The extension layer 370 may be, for example, a printed circuit board (PCB), a ceramic substrate, or a wafer for manufacturing a package. In example embodiments, the extension layer 370 may be a multi-layer PCB.

The extension layer 370 may include a substrate base 375 and a plurality of conductive connection structures 371 penetrating through the substrate base 375. The substrate base 375 may include at least one selected from among phenol resin, epoxy resin, and polyimide. The conductive connection structures 371 may include a plurality of wiring patterns 372 extending in a horizontal direction (e.g., the X-direction and/or the Y-direction) and a plurality of conductive vias 373 extending in a vertical direction (e.g., the Z-direction). The conductive connection structures 371 may include copper, nickel, stainless steel, or beryllium copper. The conductive vias 373 may penetrate through at least a portion of the substrate base 375 to electrically connect the wiring patterns 372 positioned on different wiring layers in the extension layer 370.

The first molding layer 321 may fill a mounting space of the extension layer 370 and may cover at least a portion of the IC device 100. In example embodiments, the first molding layer 321 may include an insulating polymer or an epoxy resin. For example, the first molding layer 321 may include an epoxy mold compound (EMC). A portion of the second conductive redistribution pattern 420 of the second redistribution structure 400 may penetrate through the first molding layer 321 and the second wiring insulating layer 149 and may be connected to the second conductive wiring pattern 148 of the second interconnect structure 140.

Figure 11:
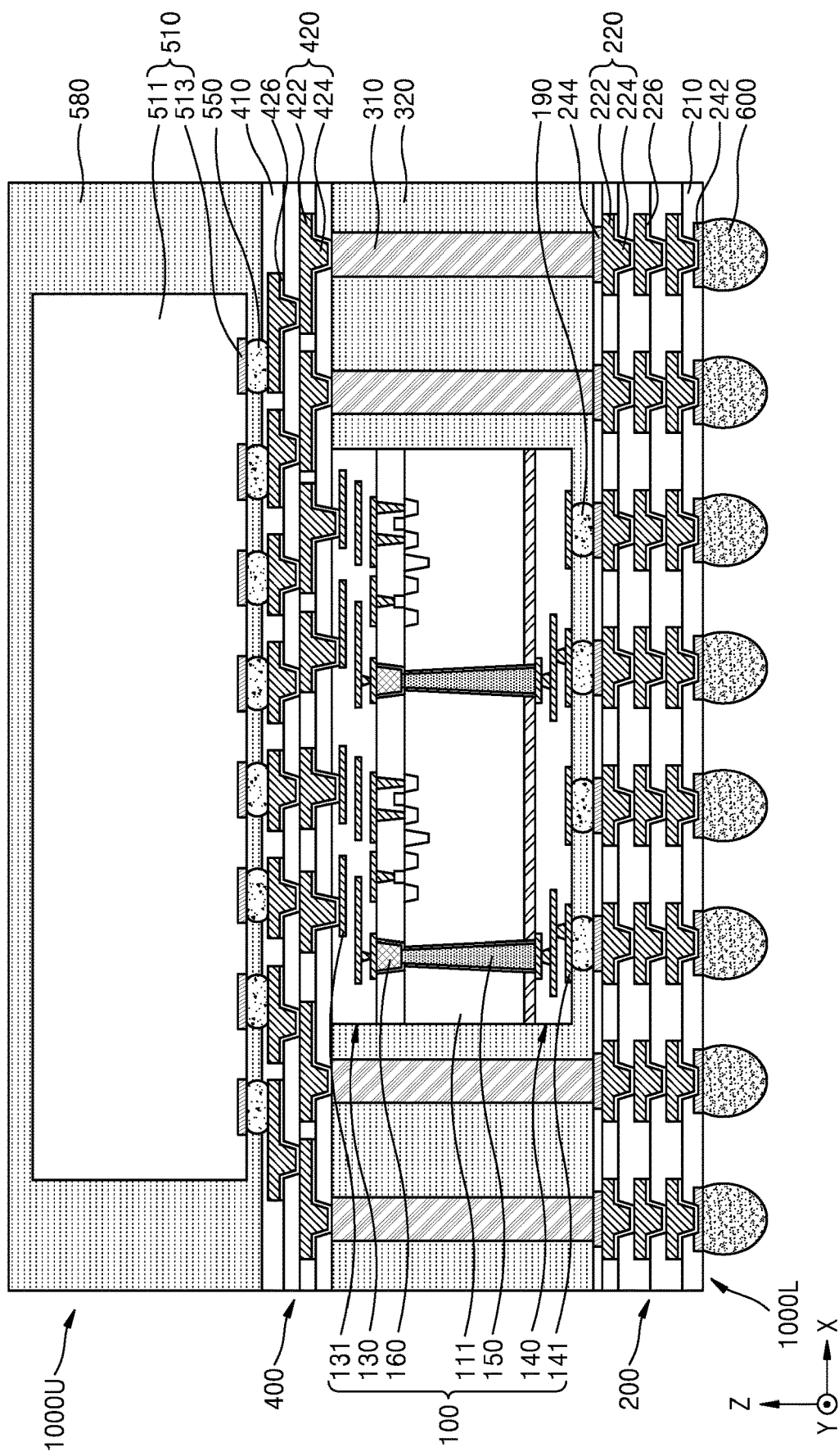
FIG. 11 is a cross-sectional view illustrating a semiconductor package according to example embodiments of the inventive concept.

FIG. 11 is a cross-sectional view illustrating a semiconductor package 1000b according to example embodiments of the inventive concept. Hereinafter, the semiconductor package 1000b shown in FIG. 11 will be described, focusing on differences from the semiconductor package 1000 described above with reference to FIG. 8.

Referring to FIG. 11 together with FIGS. 1 and 2, the semiconductor package 1000b may have a package-on-package structure in which an upper package 1000U is stacked on a lower package 1000L.

The lower package 1000L may include a first redistribution structure 200, an IC device 100, a first molding layer 320, a conductive post 310, and a second redistribution structure 400. The lower package 1000L may be substantially the same as or similar to the semiconductor package 1000 of FIG. 9.

The upper package 1000U may include an upper IC device 510 and a second molding layer 580.

The upper IC device 510 may be mounted on the second redistribution structure 400. The upper IC device 510 may include a second semiconductor substrate 511 and a plurality of connection pads 513 positioned on an active surface of the second semiconductor substrate 511. The upper IC device 510 may be positioned on the second redistribution structure 400 such that the connection pad 513 faces the second redistribution structure 400. A plurality of connection bumps 550, such as micro bumps, may be positioned between the connection pads 513 of the upper IC device 510 and the second redistribution structure 400. For example, each connection bump 550 may contact a lower surface of a connection pad 513 and an upper surface of a second redistribution line 422 of the second conductive redistribution pattern 420. The upper IC device 510 may be mounted on the second redistribution structure 400 through the connection bump 550 in a flip-chip manner.

The second molding layer 580 may be positioned on the second redistribution structure 400 and may cover at least a portion of the upper IC device 510. For example, the second molding layer 580 may cover a sidewall and an upper surface of the upper IC device 510. In example embodiments, the second molding layer 580 may include an insulating polymer or an epoxy resin. For example, the second molding layer 580 may include an epoxy mold compound (EMC).

In some example embodiments, the upper IC device 510 may be a logic semiconductor chip. For example, the upper IC device 510 may be a central processing unit chip, a graphics processing unit chip, or an application processor chip. In some example embodiments, the upper IC device 510 may include a memory semiconductor chip. For example, the upper IC device 510 may include a DRAM chip, an SRAM chip, a flash memory chip, an EEPROM chip, a PRAM chip, an MRAM chip, or an RRAM chip.

The IC device 100 and the upper IC device 510 may be positioned so that an active surface of the first semiconductor substrate 111 faces an active surface of the second semiconductor substrate 511. The IC device 100 and the upper IC device 510 may be configured to exchange signals such as a data signal and a control signal with each other through the second redistribution structure 400. In this case, a length of the signal transmission path between the IC device 100 and the upper IC device 510 is reduced, so that the IC device 100 may exchange signals with the upper IC device 510 at a high speed.

FIGS. 12A to 12L are cross-sectional views illustrating a method of manufacturing an IC device according to example embodiments of the inventive concept. Hereinafter, a method of manufacturing the IC device 100 illustrated in FIGS. 1 and 2 will be described with reference to FIGS. 12A to 12L.

Figure 12A:
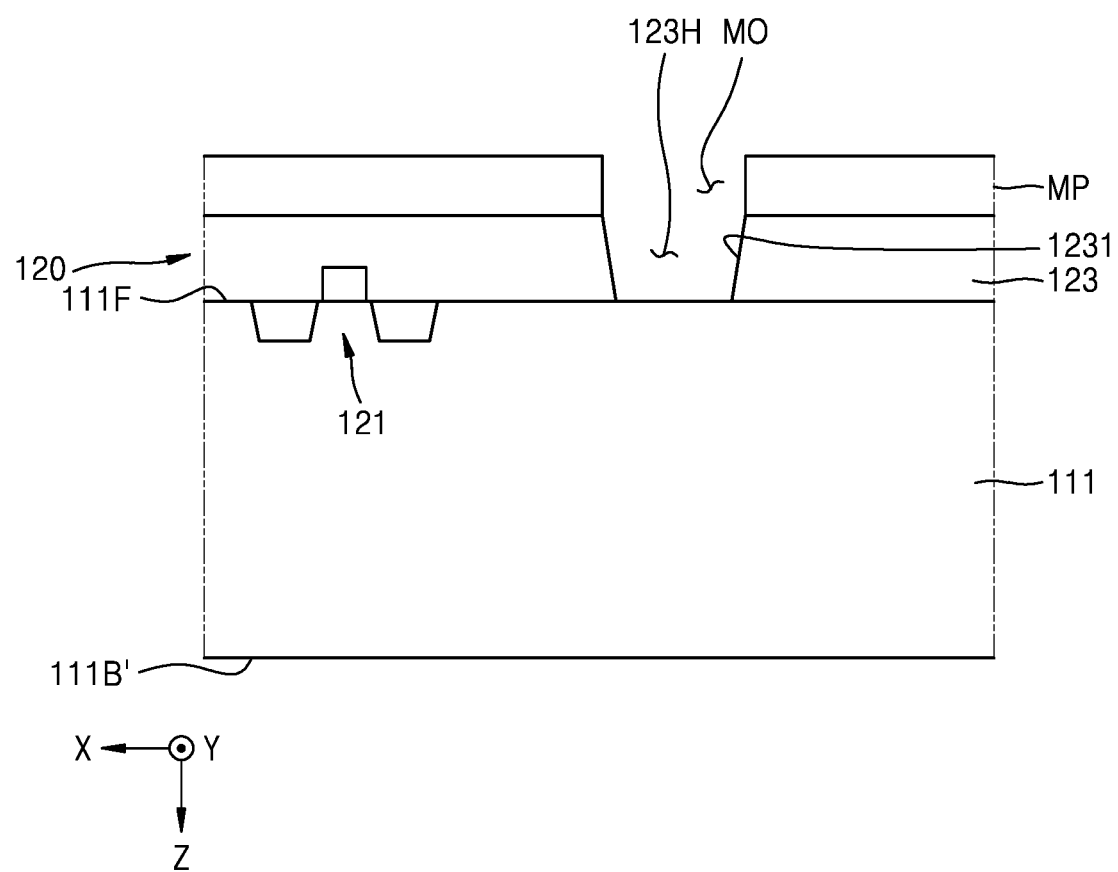
FIGS. 12A to 12L are cross-sectional views illustrating a method of manufacturing an IC device according to example embodiments of the inventive concept.

Referring to FIG. 12A, the first semiconductor substrate 111 is prepared, and the FEOL structure 120 is formed on the first semiconductor substrate 111. After the FEOL structure 120 is formed, a mask pattern MP is formed on the first insulating layer 123 of the FEOL structure 120. A mask opening MO exposing a portion of the upper surface of the first insulating layer 123 is formed in the mask pattern MP. The mask pattern MP may include, for example, photoresist.

After the mask pattern MP is formed, the first insulating layer 123 is etched using the mask pattern MP as an etching mask to form a recess 123H in the first insulating layer 123. The recess 123H may penetrate through the first insulating layer 123, and the first surface 111F of the first semiconductor substrate 111 may be exposed through the recess 123H. However, although it is described that the recess 123H is formed through an etching process, the inventive concept is not limited thereto, and the recess 123H may also be formed through a laser drilling process.

In example embodiments, the recess 123H formed in the first insulating layer 123 may have a tapered shape with a horizontal width narrowing toward the first surface 111F of the first semiconductor substrate 111. The sidewall 123I of the first insulating layer 123 defining the recess 123H of the first insulating layer 123 may be formed to have an inclination with respect to a vertical direction (e.g., the Z-direction).

Figure 12B:
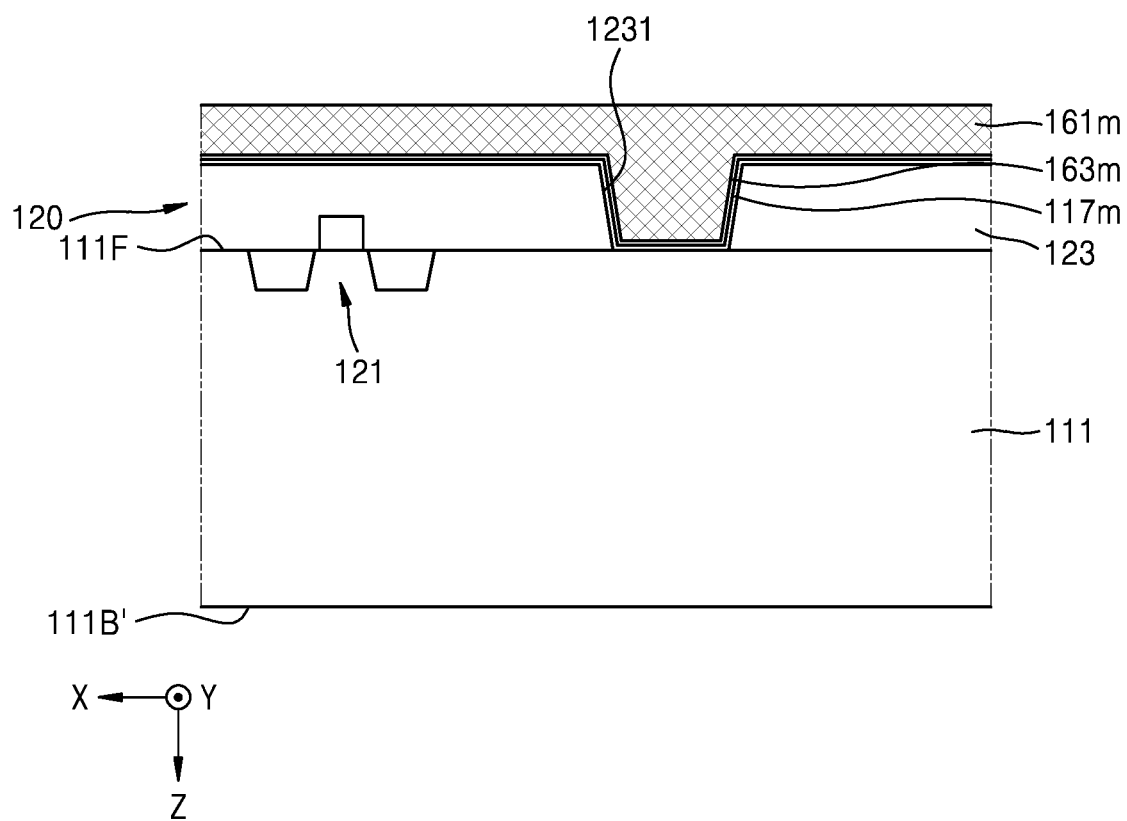

Referring to FIGS. 12A and 12B, after the recess 123H of the first insulating layer 123 is formed, the mask pattern MP is removed and a preliminary pad insulating layer 117m is formed. The preliminary pad insulating layer 117m may be formed to conformally cover an upper surface of the first insulating layer 123, the sidewall 123I of the first insulating layer 123 defining the recess 123H of the first insulating layer 123, and a portion of the first surface 111F of the first semiconductor substrate 111 exposed through the recess 123H of the first insulating layer 123.

After the preliminary pad insulating layer 117m is formed, a second preliminary conductive barrier layer 163m is formed on the preliminary pad insulating layer 117m. After the second preliminary conductive barrier layer 163m is formed, a preliminary conductive core layer 161m may be formed on the second preliminary conductive barrier layer 163m. The preliminary conductive core layer 161m may be formed through, for example, an electroplating process. For example, in order to form the preliminary conductive core layer 161m, an operation of forming a seed metal layer covering the second preliminary conductive barrier layer 163m by performing a PVD process such as a sputtering process and an operation of forming a plating layer by performing electroplating process using the seed metal layer as a seed may be performed. The preliminary conductive core layer 161m is formed on the second preliminary conductive barrier layer 163m and may be formed to fill the recess 123H of the first insulating layer 123.

Figure 12C:
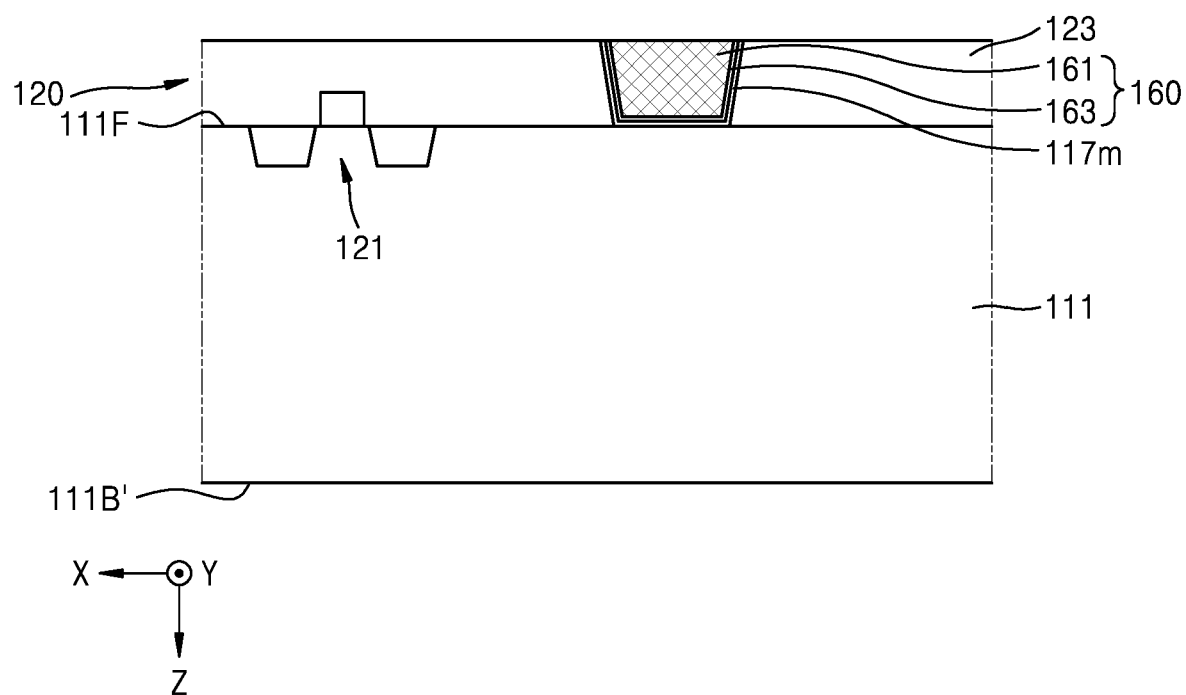

Referring to FIGS. 12B and 12C, a planarization process is performed to remove a portion of the structure on the first surface 111F of the first semiconductor substrate 111. A portion of the preliminary pad insulating layer 117m, a portion of the second preliminary conductive barrier layer 163m, and a portion of the preliminary conductive core layer 161m may be removed through the planarization process. The planarization process may be performed until the other portion of the second preliminary conductive barrier layer 163m except for a portion of the second preliminary conductive barrier layer 163m buried in the recess 123H of the first insulating layer 123, and the other portion of the preliminary conductive core layer 161m, except for a portion of the preliminary conductive core layer 161m buried in the recess 123H of the first insulating layer 123, are removed. As a result of the planarization process, the portion of the second preliminary conductive barrier layer 163m filling the recess 123H of the first insulating layer 123 and the portion of the preliminary conductive core layer 161m may form the electrode landing pad 160.

For example, the planarization process may include a chemical mechanical polishing (CMP) process. The upper surface of the first insulating layer 123 and the surface of the electrode landing pad 160 obtained through the planarization process may be substantially coplanar.

Figure 12D:
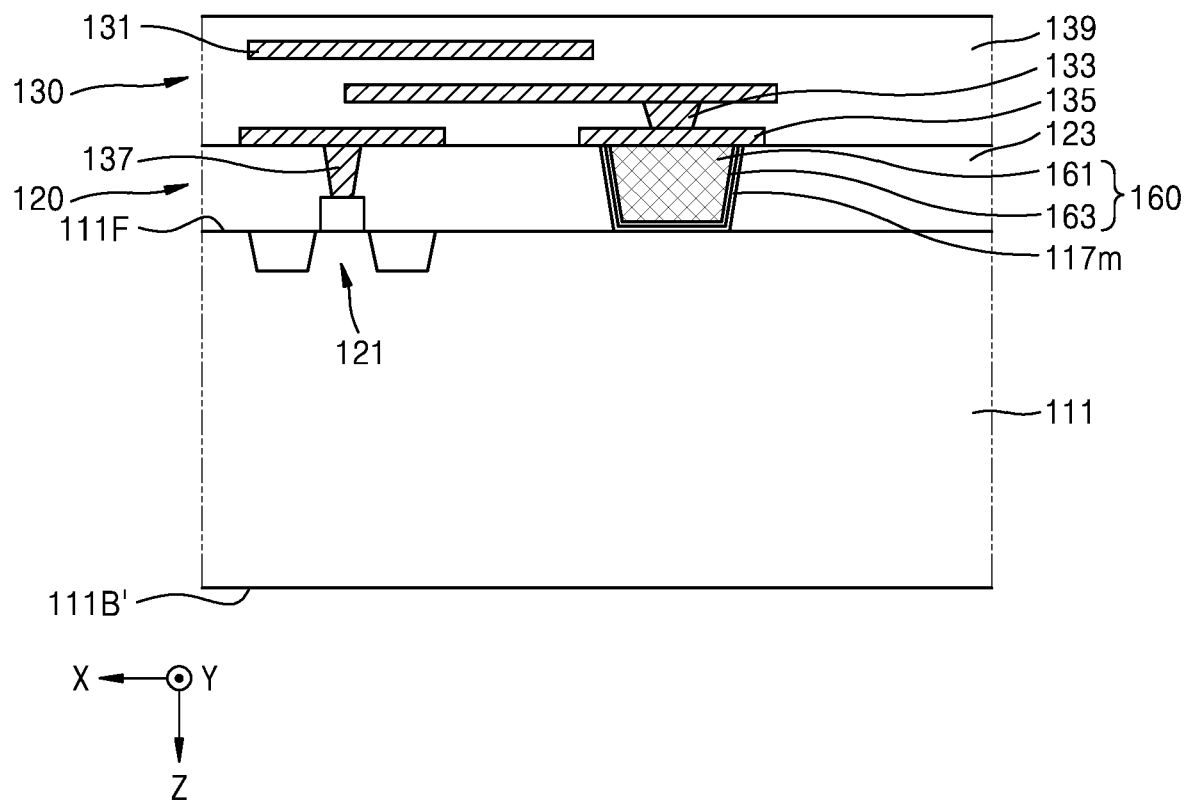

Referring to FIG. 12D, after the electrode landing pad 160 is formed, the first interconnect structure 130 is formed on the FEOL structure 120. The first interconnect structure 130 may include a first wiring insulating layer 139 including a plurality of interlayer insulating layers sequentially stacked on the first insulating layer 123 of the FEOL structure 120, and a first conductive line 131, a first conductive via 133, a conductive pad 135, and a conductive contact plug 137. In order to form the first interconnect structure 130, the operation of forming an interlayer insulating layer including a hole for a metal wiring and an operation of forming a metal film filling the hole for a metal wiring of the interlayer insulating layer may be repeated several times. The first interconnect structure 130 may be formed using, for example, a damascene process.

Figure 12E:
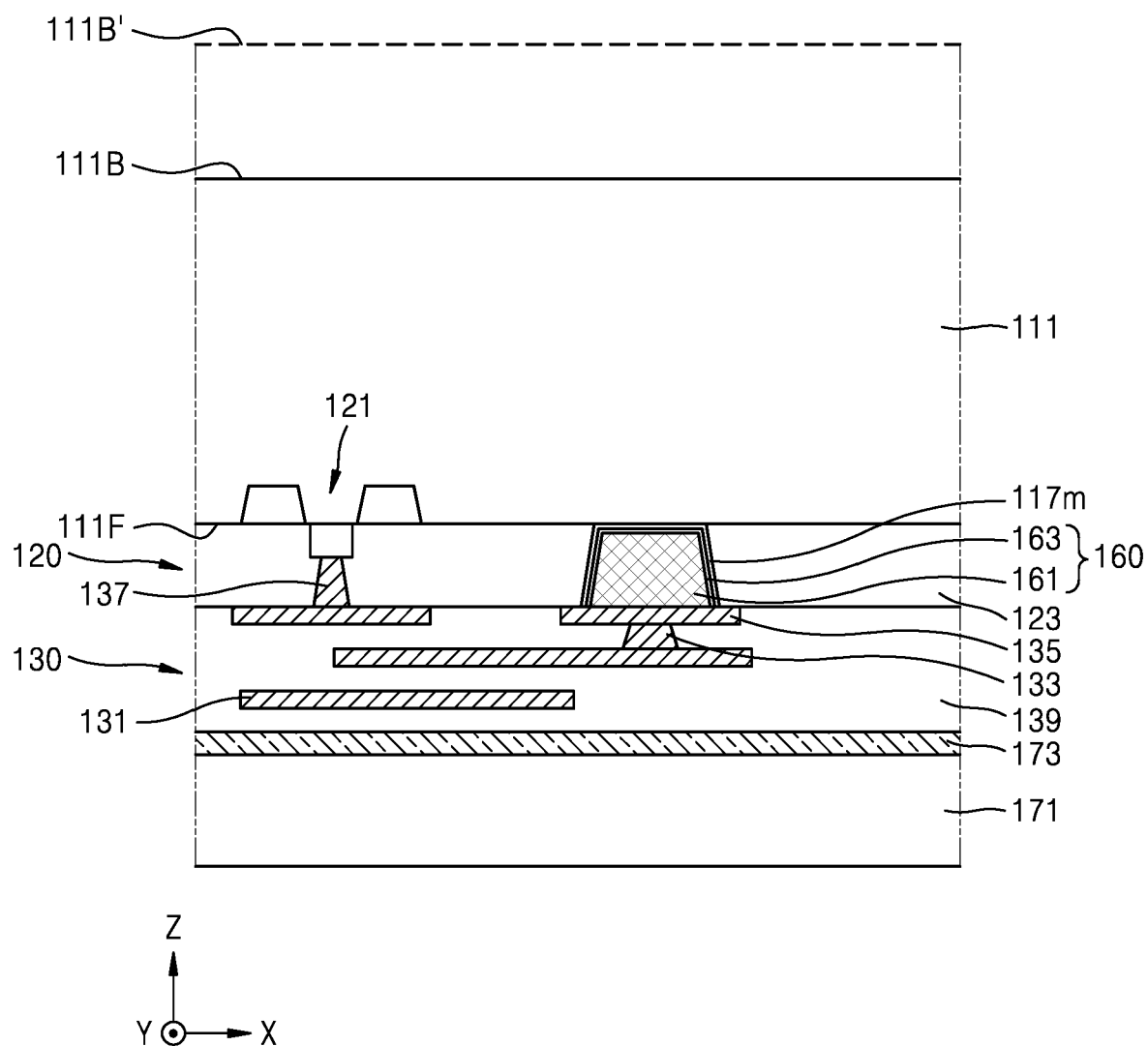

Referring to FIGS. 12D and 12E, a resultant product of FIG. 12D is turned over and attached to a support substrate 171. The resultant product of FIG. 12D may be attached to the support substrate 171 by an adhesive material layer 173 interposed between the first interconnect structure 130 and the support substrate 171. The adhesive material layer 173 may include an adhesive film or a release film. The first surface 111F of the first semiconductor substrate 111 may face the support substrate 171, and the second surface 111B' of the first semiconductor substrate 111 may be exposed.

After the resultant product of FIG. 12D is attached to the support substrate 171, a portion of the first semiconductor substrate 111 may be removed so that a thickness of the first semiconductor substrate 111 is reduced. For example, in order to thin the first semiconductor substrate 111, a planarization process such as a CMP process may be performed on the second surface 111B'. Through a thinning process of the first semiconductor substrate 111, a distance between the second surface 111B and the first surface 111F of the first semiconductor substrate 111, that is, a thickness of the first semiconductor substrate 111, may be reduced. For example, the thickness of the thinned first semiconductor substrate 111 may be between about 300 nm and about 800 nm.

Figure 12F:
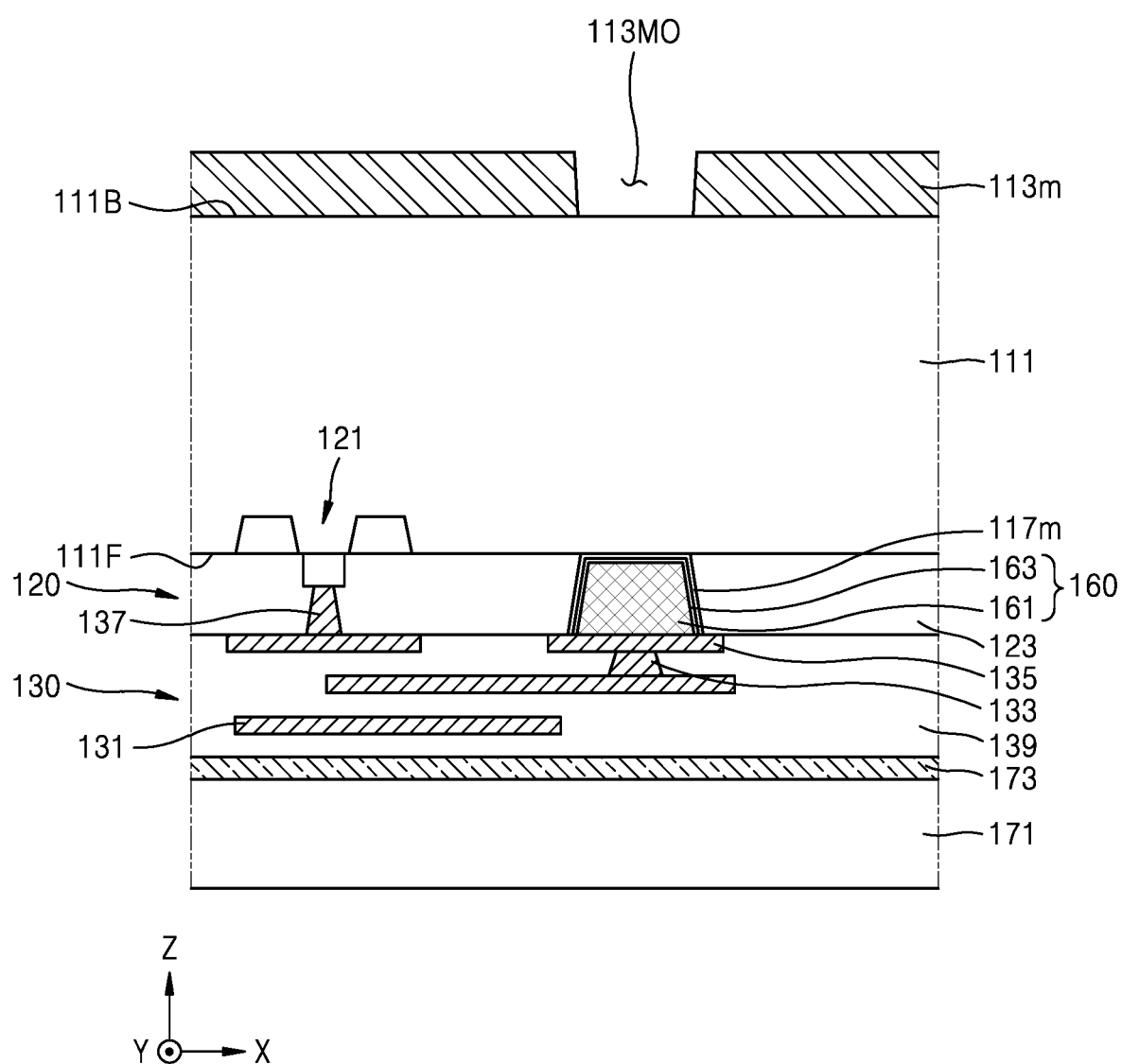

Referring to FIG. 12F, a mask pattern 113m including a mask opening 113MO is formed on the second surface 111B of the first semiconductor substrate 111. A portion of the second surface 111B of the first semiconductor substrate 111 may be exposed through the mask opening 113MO of the mask pattern 113m. The mask pattern 113m may have a structure in which a photoresist layer including a photoresist material is stacked on a hard disk layer including a carbon-containing material such as a spin on carbon hard mask (SOC) material.

Figure 12G:
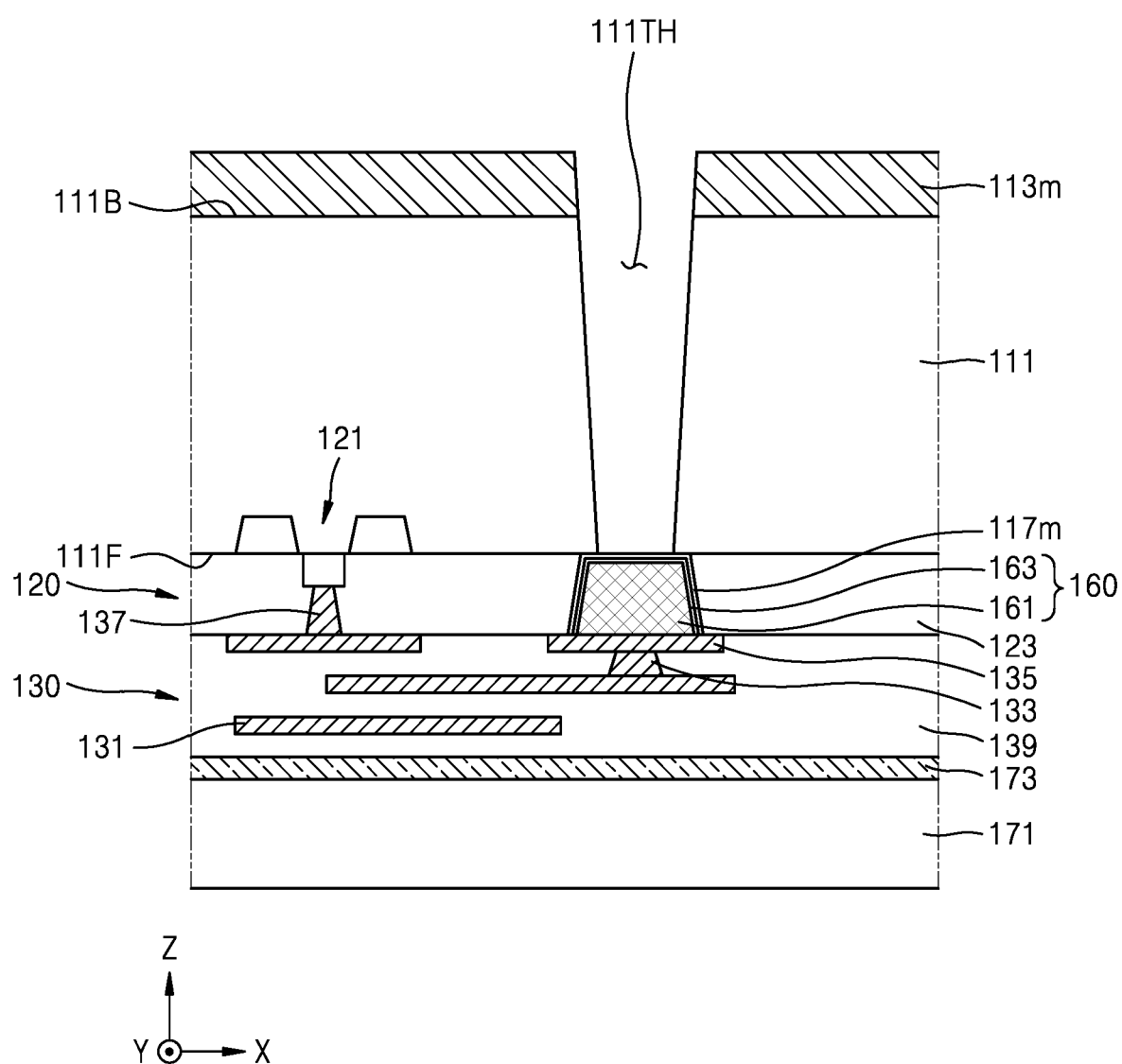

Referring to FIG. 12G, the first semiconductor substrate 111 is etched using the mask pattern 113m as an etching mask to form a through-hole 111TH penetrating through the first semiconductor substrate 111. The through-hole 111TH may extend from the second surface 111B to the first surface 111F of the first semiconductor substrate 111. The preliminary pad insulating layer 117m may be exposed through the through-hole 111TH. For example, the etching process for the first semiconductor substrate 111 may include an anisotropic etching process. For example, the etching process for the first semiconductor substrate 111 may include a dry etching process using a fluorine-containing gas.

In example embodiments, the through-hole 111TH of the first semiconductor substrate 111 may have a tapered shape with a horizontal width narrowing toward the first surface 111F of the first semiconductor substrate 111. A sidewall of the first semiconductor substrate 111 defining the through-hole 111TH of the first semiconductor substrate 111 may be formed to have an inclination with respect to a vertical direction (e.g., the Z-direction).

Figure 12H:
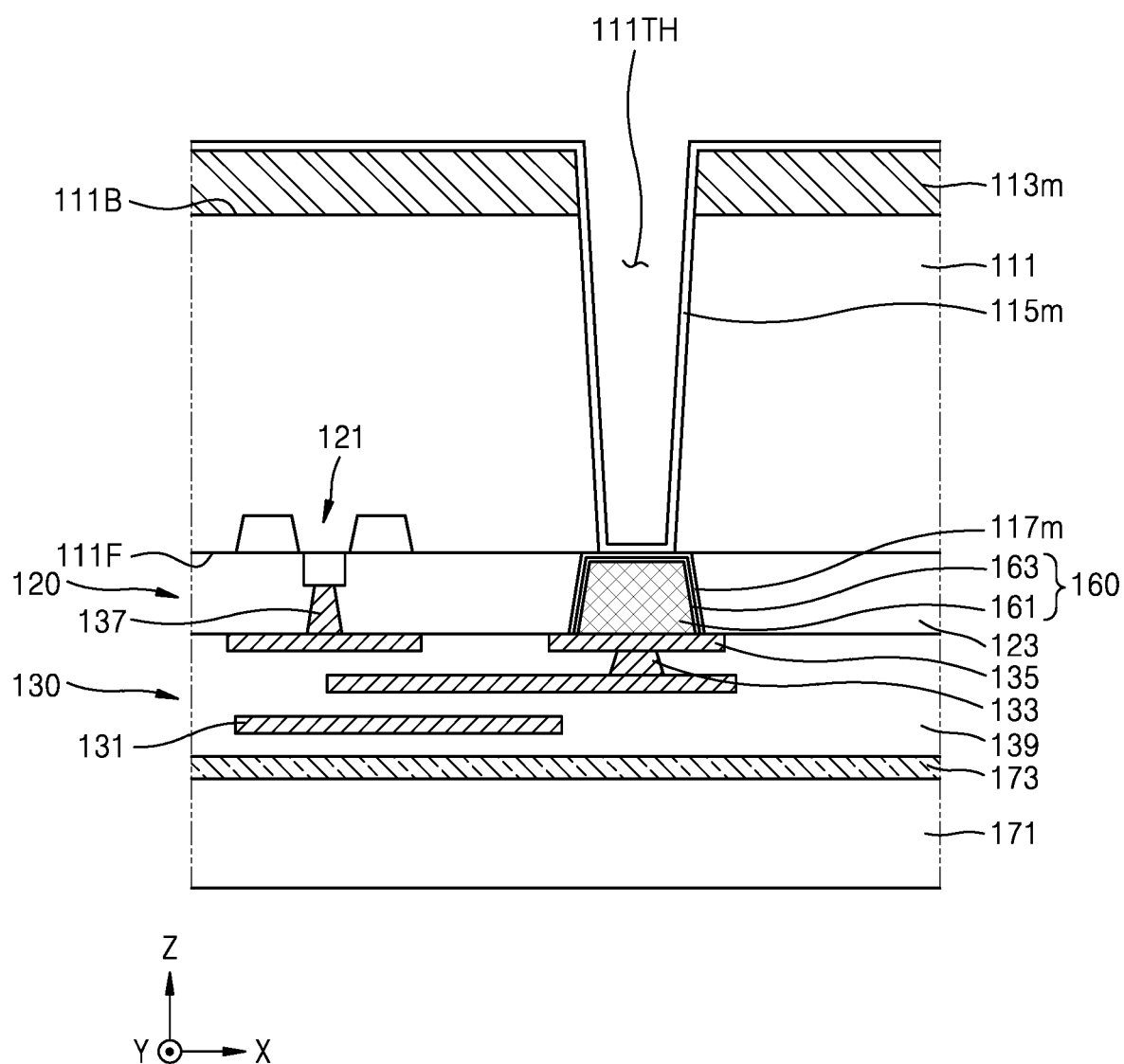

Referring to FIG. 12H, after the through-hole 111TH is formed in the first semiconductor substrate 111, a preliminary via insulating layer 115m is formed. The preliminary via insulating layer 115m may conformally cover an upper surface of the mask pattern 113m, a sidewall of the mask pattern 113m defining the mask opening 113MO, a sidewall of the first semiconductor substrate 111 defining the through-hole 111TH, and a surface of the preliminary pad insulating layer 117m exposed through the through-hole 111TH.

Figure 12I:
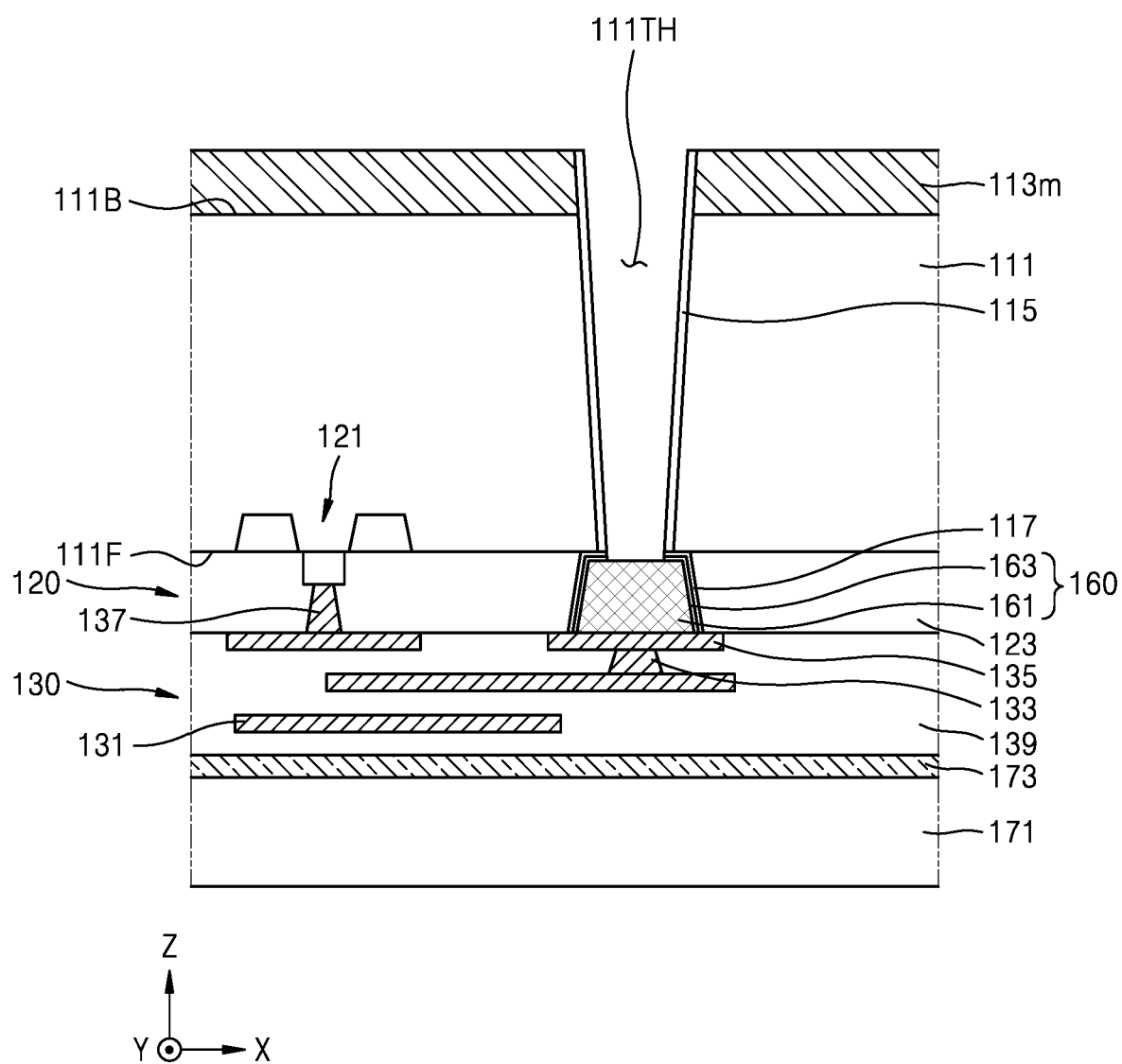

Referring to FIGS. 12H and 12I, a portion of the preliminary via insulating layer 115m on the mask pattern 113m, a portion of the preliminary via insulating layer 115m covering the upper surface of the electrode landing pad 160, and a portion of the preliminary pad insulating layer 117m covering the upper surface of the electrode landing pad 160 are removed. For example, in order to remove a portion of the preliminary via insulating layer 115m and a portion of the preliminary pad insulating layer 117m, an anisotropic etching process, for example, a dry etching process, may be performed. A portion of the preliminary via insulating layer 115m remaining after the etching process may form the via insulating layer 115. The via insulating layer 115 may cover the sidewall of the first semiconductor substrate 111 and cover the sidewall of the mask pattern 113m. In addition, a portion of the preliminary pad insulating layer 117m remaining after the etching process may form the pad insulating layer 117. The pad insulating layer 117 may include a portion covering the sidewall of the electrode landing pad 160 and a portion interposed between the upper surface of the electrode landing pad 160 and the first surface 111F of the first semiconductor substrate 111.

As a portion of the preliminary via insulating layer 115m and a portion of the preliminary pad insulating layer 117m are removed through an etching process, the upper surface of the electrode landing pad 160 may be exposed through the through-hole 111TH of the first semiconductor substrate 111. In some example embodiments, a portion of the second conductive barrier layer 163 may be removed through the etching process to expose the conductive core layer 161. In some example embodiments, a portion of the conductive core layer 161 may be removed through the etching process, so that a surface of the conductive core layer 161 may have a concave surface portion 169 as shown in FIGS. 4 and 5.

Figure 12J:
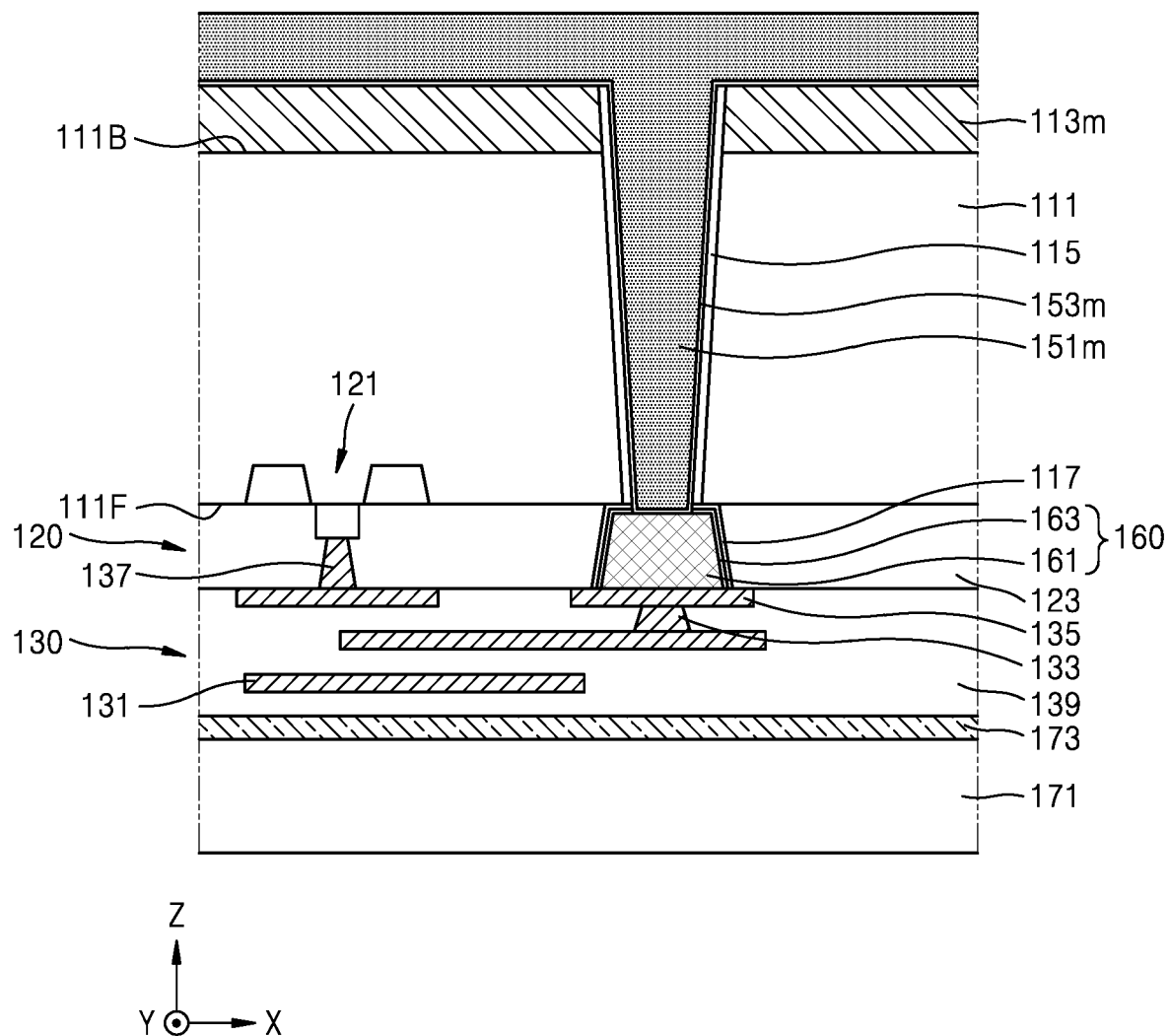

Referring to FIGS. 12I and 12J, a first preliminary conductive barrier layer 153m is formed. The first preliminary conductive barrier layer 153m may conformally cover an upper surface of the mask pattern 113m, the via insulating layer 115, and the upper surface of the electrode landing pad 160 exposed through the through-hole 111TH of the first semiconductor substrate 111.

After the first preliminary conductive barrier layer 153m is formed, a conductive material layer 151m may be formed on the first preliminary conductive barrier layer 153m. The conductive material layer 151m may be formed through, for example, an electroplating process. For example, in order to form the conductive material layer 151m, an operation of forming a seed metal layer covering the first preliminary conductive barrier layer 153m by performing a PVD process such as a sputtering process and an operation of forming a plating layer by performing an electroplating process using the seed metal layer as a seed may be sequentially performed. The conductive material layer 151m may be formed on the first preliminary conductive barrier layer 153m and may be formed to fill the through-hole 111TH of the first semiconductor substrate 111.

Figure 12K:
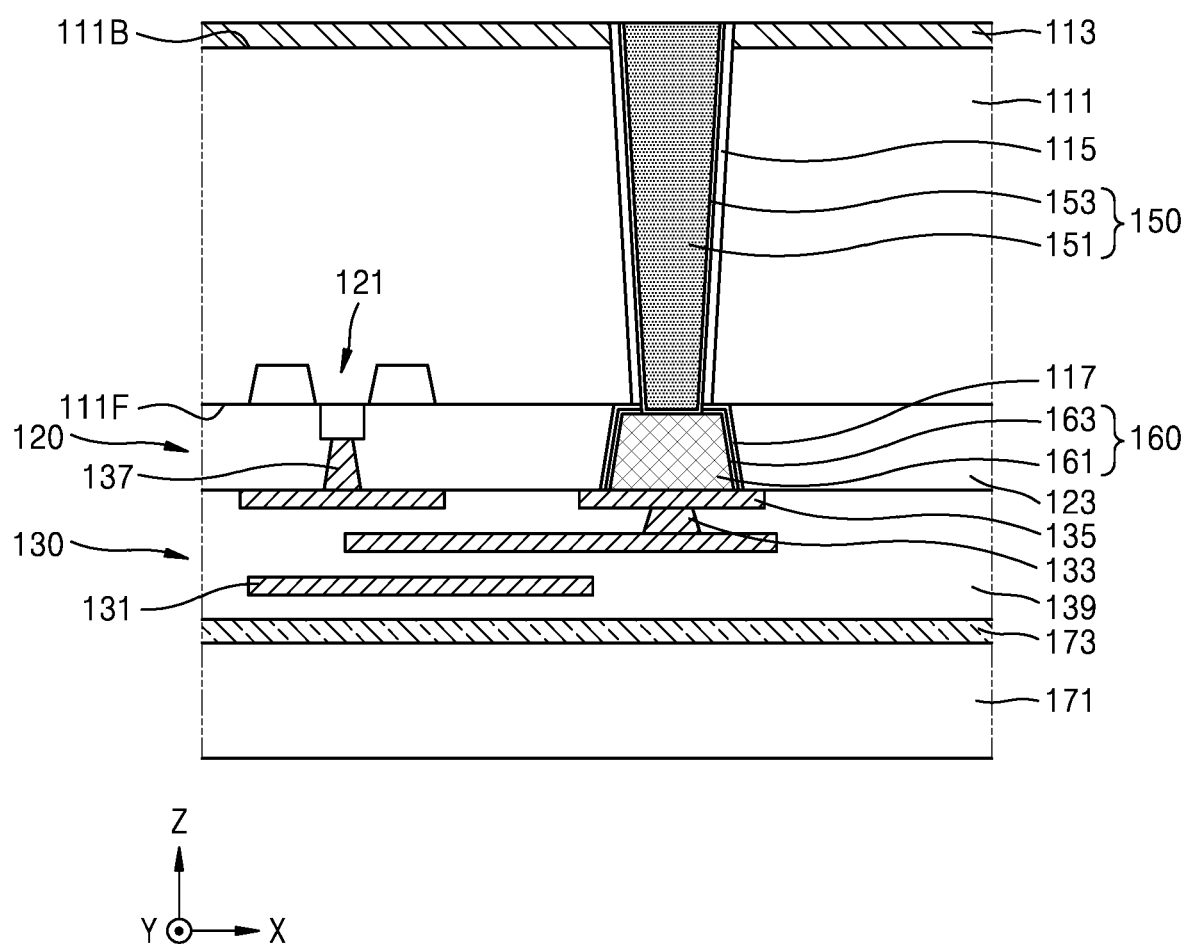

Referring to FIGS. 12J and 12K, a planarization process such as a CMP process may be performed to remove a portion of the structure on the second surface 111B of the first semiconductor substrate 111. Through the planarization process, a portion of the first preliminary conductive barrier layer 153m and a portion of the conductive material layer 151m may be removed. The planarization process may be performed until the another portion of the first preliminary conductive barrier layer 153m excluding a portion of the first preliminary conductive barrier layer 153m buried in the through-hole 111TH of the first semiconductor substrate 111 and another portion of the conductive material layer 151m excluding a portion of the conductive material layer 151m buried in the through-hole 111TH of the first semiconductor substrate 111 are removed. As a result of the planarization process, a portion of the first preliminary conductive barrier layer 153m and a portion of the conductive material layer 151m filling the through-hole 111TH of the first semiconductor substrate 111 may form the conductive plug 151 and the first conductive barrier layer 153 of the through-electrode 150.

Also, a portion of the mask pattern 113m may be removed through the planarization process. A portion of the mask pattern 113m remaining after the planarization process may form a passivation layer 113. A surface of the passivation layer 113 and a surface of the through-electrode 150 planarized through the planarization process may be substantially coplanar.

Figure 12L:
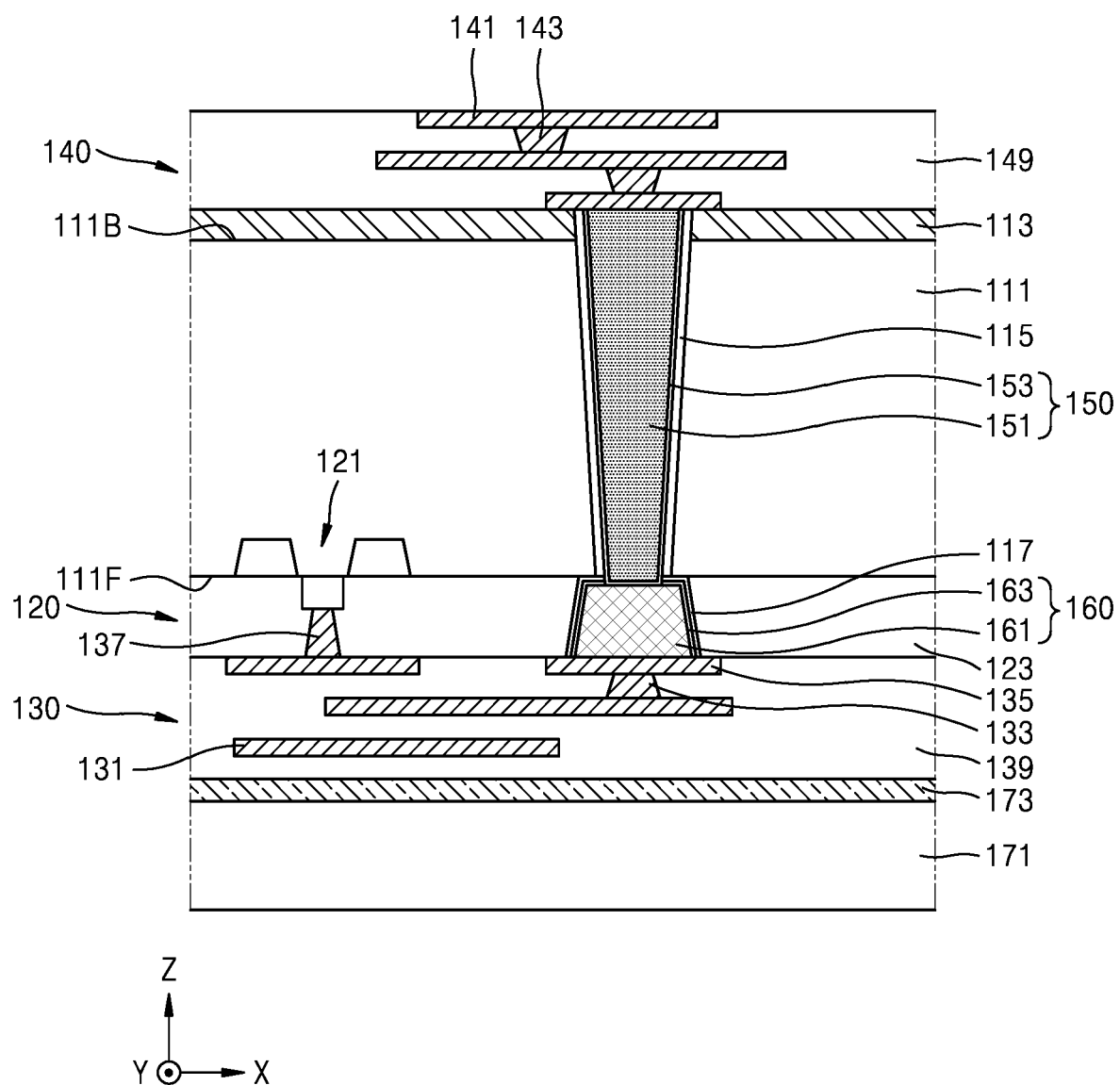

Referring to FIG. 12L, the second interconnect structure 140 is formed on the passivation layer 113. The second interconnect structure 140 may include a second wiring insulating layer 149 including a plurality of interlayer insulating layers sequentially stacked on the passivation layer 113, a second conductive line 141 and a second conductive via 143. In order to form the second interconnect structure 140, the operation of forming an interlayer insulating layer including a hole for a metal wiring and an operation of forming a metal film filling the hole for a metal wiring of the interlayer insulating layer may be repeated several times. The second interconnect structure 140 may be formed using, for example, a damascene process.

After the second interconnect structure 140 is formed, a sawing process of cutting the resultant product of FIG. 12L along a scribe lane of the first semiconductor substrate 111 may be performed. Through the sawing process, the resultant product of FIG. 12L may be separated into a plurality of IC devices. The support substrate 171 may be separated from the first interconnect structure 130 to form the IC device 100 described above with reference to FIGS. 1 and 2.

In other example embodiments, the support substrate 171 may remain without being removed as shown in FIG. 8 to form a cover substrate 172 covering the first interconnect structure 130. When the support substrate 171 remains to cover the first interconnect structure 130, a polishing process for adjusting the thickness of the support substrate 171 may be further performed.

In general, as an aspect ratio of the through-electrode 150 is large, the plating layer constituting the through-electrode 150 may not be sufficiently filled in the through-hole 111TH of the first semiconductor substrate 111 or voids may be formed in the plating layer. As a result, reliability of the through-electrode 150 may be deteriorated. In addition, when the thickness of the pad structure on which the through-electrode 150 is landed is thin, even a landing region of the pad structure may be removed during an etching process for opening the pad structure.

According to example embodiments of the inventive concept, the through-electrode 150 may be formed to land on the electrode landing pad 160 extending from the conductive pad 135 of the first interconnect structure 130 to the first surface 111F of the first semiconductor substrate 111. Because a height of the through-electrode 150 may be reduced as high as a height of the electrode landing pad 160, the aspect ratio of the through-electrode 150 may decrease. Because a difficulty of the process for forming the through-electrode 150 is reduced, a non-charging issue in the plating process for forming the through-electrode 150 may be reduced. In addition, because the electrode landing pad 160 is formed to have a thickness similar to the thickness of the first insulating layer 123, the landing region of the electrode landing pad 160 may not be removed during the etching process for opening the electrode landing pad 160. Accordingly, reliability of the electrical connection between the through-electrode 150 and the electrode landing pad 160 may be improved, and ultimately, reliability of the IC device 100 may be improved.

FIGS. 13A to 13E are cross-sectional views illustrating a method of manufacturing a semiconductor package according to example embodiments of the inventive concept. Hereinafter, a method of manufacturing the semiconductor package 1000b illustrated in FIG. 11 will be described with reference to FIGS. 13A to 13E.

Figure 13A:
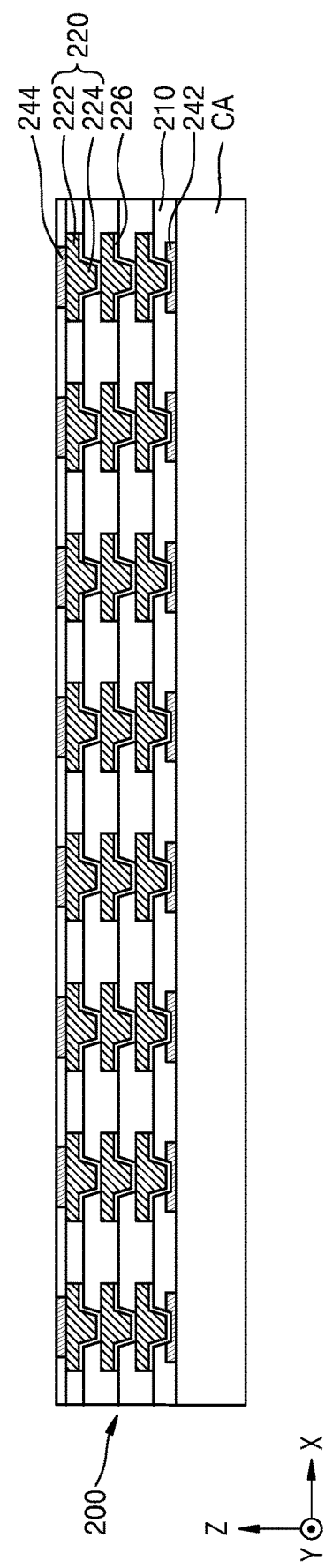
FIGS. 13A to 13E are cross-sectional views illustrating a method of manufacturing a semiconductor package according to example embodiments of the inventive concept.

Referring to FIG. 13A, the first redistribution structure 200 is formed on a carrier substrate CA. The first redistribution structure 200 may include a plurality of first redistribution insulating layers 210 sequentially stacked on the carrier substrate CA, a first conductive redistribution pattern 220 insulated by the first redistribution insulating layers 210, external connection pads 242, and connection pads 244.

In order to form the first redistribution structure 200, an external connection pad 242 may be first formed on the carrier substrate CA. To form the external connection pad 242, a conductive material layer may be formed on the carrier substrate CA, and patterning may be performed on the conductive material layer. After the external connection pad 242 is formed, a first operation of forming an insulating layer covering the external connection pad 242 and having a via hole and a second operation of forming the first redistribution via 224 filling the via hole of the insulating layer and the first redistribution line 222 extending along an upper surface of the insulating layer may be performed, and thereafter, the first conductive redistribution pattern 220 may be formed by repeating the first and second operations several times. After the first conductive redistribution pattern 220 is formed, a connection pad 244 connected to the first conductive redistribution pattern 220 may be formed on the first conductive redistribution pattern 220.

Figure 13B:
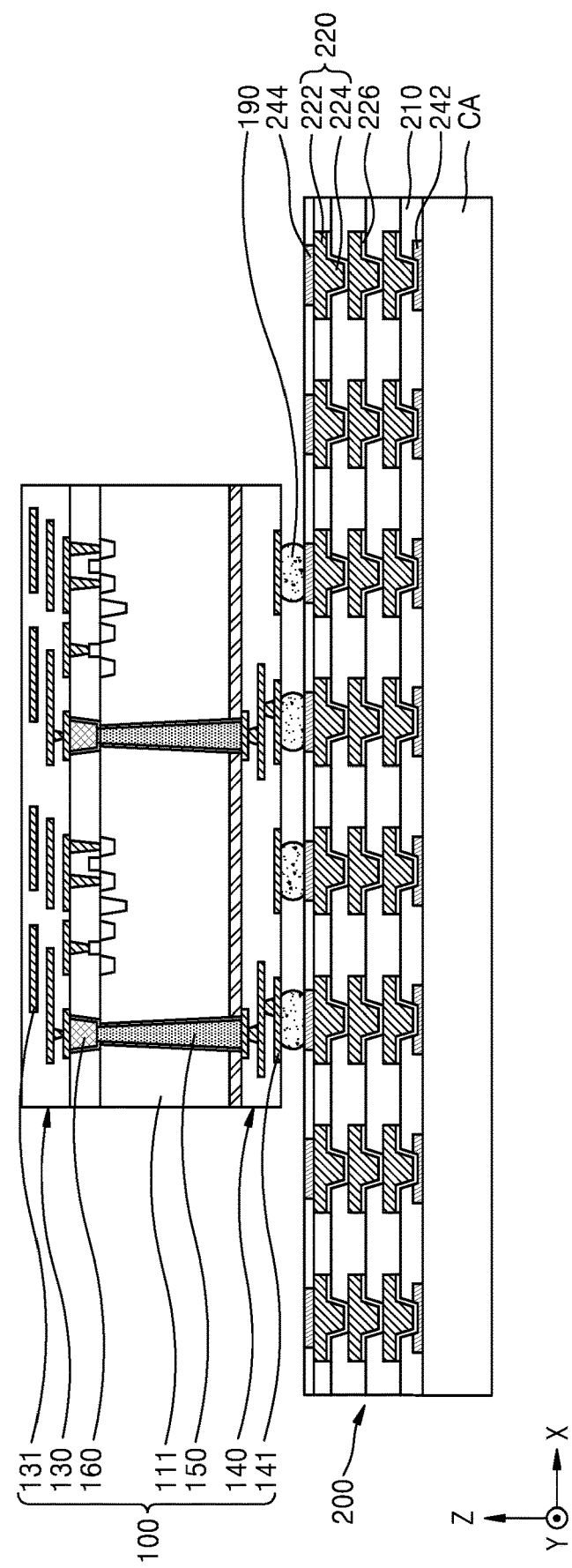

Referring to FIG. 13B, the IC device 100 is attached on the first redistribution structure 200. The IC device 100 may be attached on the first redistribution structure 200 such that the second interconnect structure 140 faces the first redistribution structure 200. The IC device 100 may be mounted on the first redistribution structure 200 through the connection bumps 190.

Figure 13C:
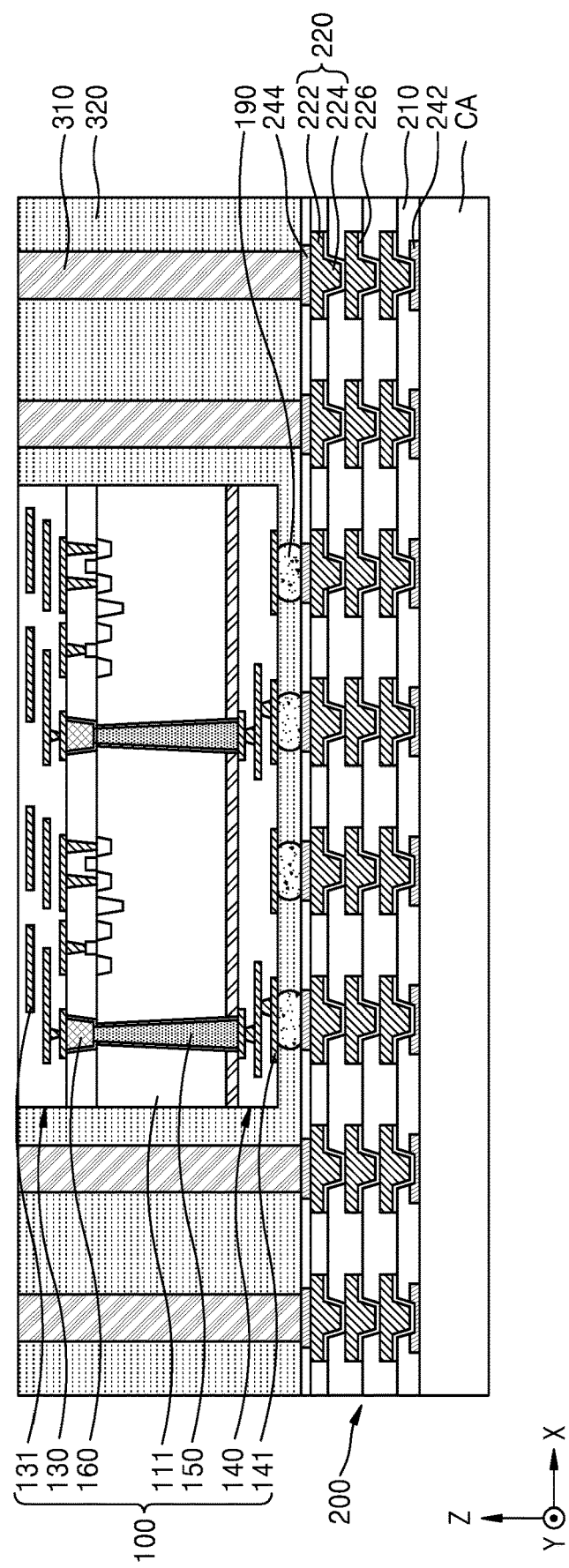

Referring to FIG. 13C, the conductive post 310 and the first molding layer 320 are formed on the first redistribution structure 200. In example embodiments, the first molding layer 320 may be formed to fill a gap between the IC device 100 and the first redistribution structure 200 through a molded underfill process. In other example embodiments, an underfill layer may be first formed to fill a gap between the IC device 100 and the first redistribution structure 200 through a capillary under-fill method, and the first molding layer 320 may then be formed.

In example embodiments, the first molding layer 320 may be formed to expose an upper surface of the IC device 100. For example, in order to form the first molding layer 320, after a molding material covering the IC device 100 and the conductive post 310 is formed on the first redistribution structure 200, a planarization process may be performed on the molding material until the upper surface of the conductive post 310 and the upper surface of the IC device 100 are exposed. In this case, the upper surface of the first molding layer 320, the upper surface of the conductive post 310, and the upper surface of the IC device 100 may be coplanar.

Figure 13D:
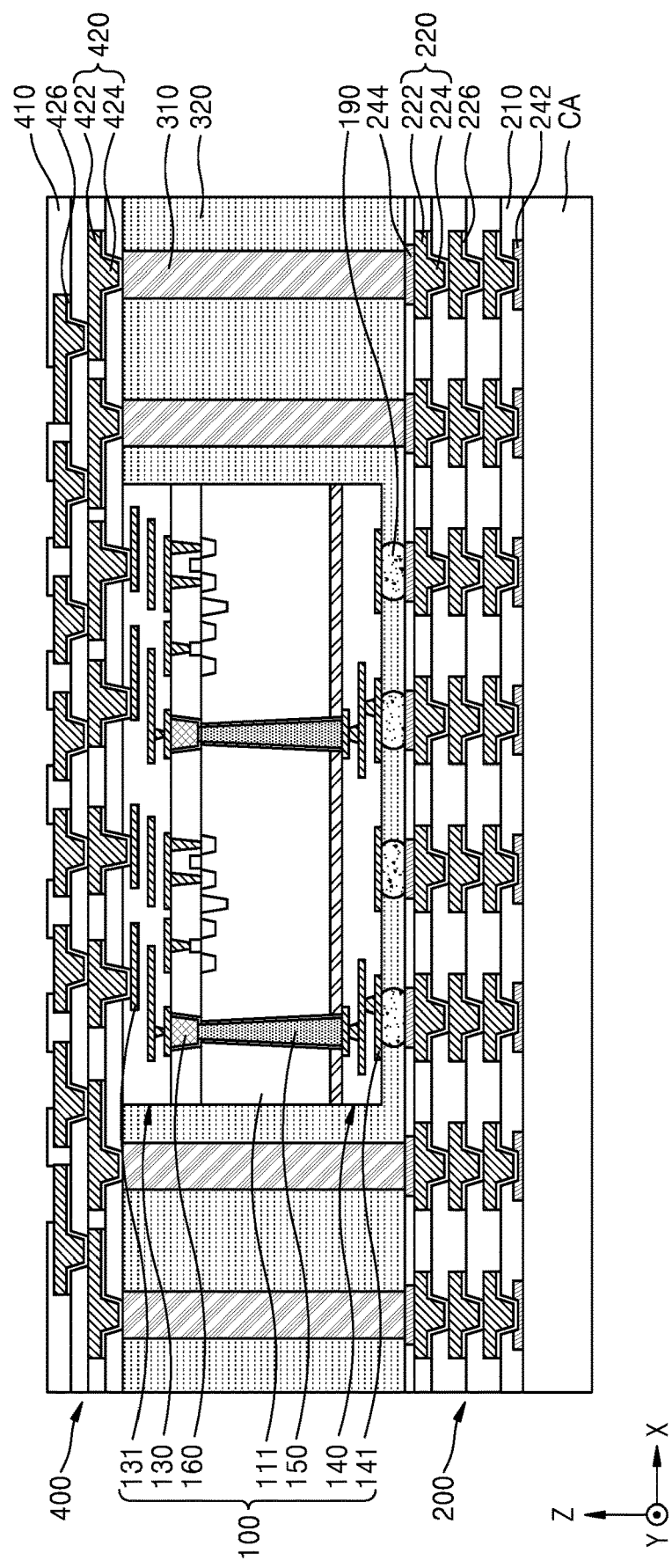

Referring to FIG. 13D, after the first molding layer 320 is formed, the second redistribution structure 400 is formed on the first molding layer 320 and the IC device 100. The second redistribution structure 400 may include a plurality of second redistribution insulating layers 410 sequentially stacked on the upper surface of the first molding layer 320 and the upper surface of the IC device 100 and a second conductive redistribution pattern 420 insulated by the second redistribution insulating layer 410. A process of forming the second redistribution structure 400 may be similar to the process of forming the first redistribution structure 200.

Figure 13E:
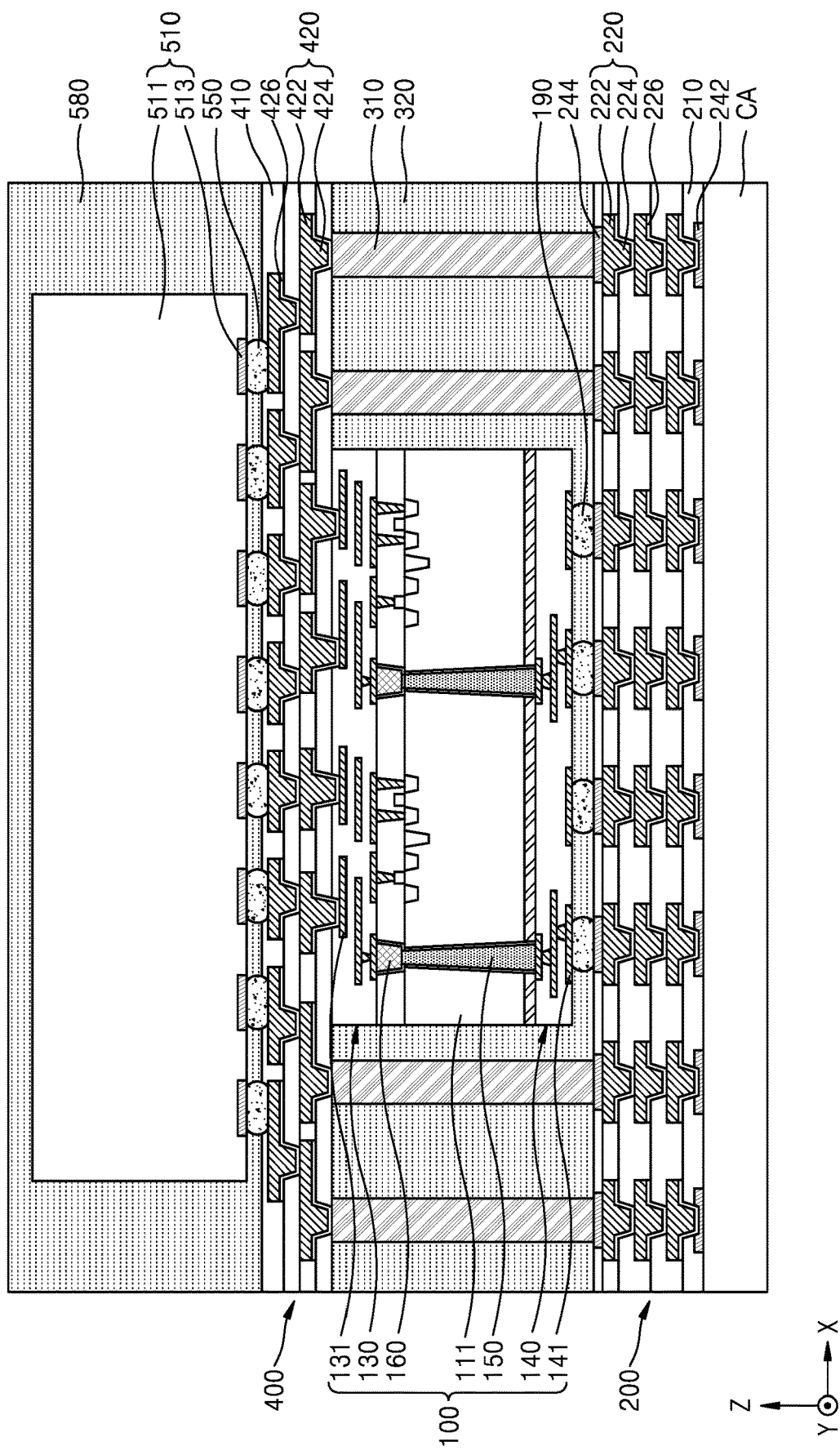

Referring to FIG. 13E, after the second redistribution structure 400 is formed, the upper IC device 510 may be mounted on the second redistribution structure 400. The upper IC device 510 may be mounted on the second redistribution structure 400 through the connection bumps 550. After the upper IC device 510 is mounted, a second molding layer 580 covering the upper IC device 510 may be formed on the second redistribution structure 400. After the second molding layer 580 is formed, the carrier substrate CA may be removed, and the external connection terminals 600 may be attached on the external connection pad 242 to manufacture the semiconductor package 1000b of FIG. 11.

While the inventive concept has been particularly shown and described with reference to embodiments thereof, it will be understood that various changes in form and details may be made therein without departing from the spirit and scope of the following claims.

What is claimed is:

1. An integrated circuit device comprising:
    a semiconductor substrate having a first surface and a second surface opposite to the first surface;
    a first insulating layer on the first surface of the semiconductor substrate;
    an electrode landing pad on the first surface of the semiconductor substrate, the electrode landing pad having a sidewall surrounded by the first insulating layer, a top surface spaced apart from the first surface of the semiconductor substrate, and a bottom surface opposite to the top surface;
    a conductive pad contacting the bottom surface of the electrode landing pad;
    a through-electrode penetrating through the semiconductor substrate and contacting the top surface of the electrode landing pad; and
    a pad insulating layer having a bottom surface in contact with the electrode landing pad and a top surface in contact with the first surface of the semiconductor substrate,
    wherein a horizontal width of the top surface of the electrode landing pad is less than a horizontal width of the bottom surface of the electrode landing pad and greater than a horizontal width of a bottom surface of the through-electrode in contact with the top surface of the electrode landing pad, wherein a horizontal width of the conductive pad is greater than the horizontal width of the bottom surface of the electrode landing pad, wherein a vertical height of the conductive pad is smaller than a vertical height of the electrode landing pad, and wherein a bottom surface of the electrode landing pad is coplanar with a bottom surface of the first insulating layer.

2. The integrated circuit device of claim 1, wherein the pad insulating layer is in contact with the first surface of the semiconductor substrate.

3. The integrated circuit device of claim 1, wherein the pad insulating layer is spaced apart from the first surface of the semiconductor substrate.

4. The integrated circuit device of claim 1, wherein the pad insulating layer further includes a portion between the sidewall of the electrode landing pad and the first insulating layer.

5. The integrated circuit device of claim 1,
wherein the conductive pad includes a conductive layer and a conductive barrier layer, and
wherein the conductive barrier layer is provided between the conductive layer and the bottom surface of the electrode landing pad.

6. The integrated circuit device of claim 1,
wherein the through-electrode has a tapered shape with a horizontal width narrowing toward the first surface of the semiconductor substrate, and
wherein the electrode landing pad has a tapered shape with a horizontal width narrowing toward the first surface of the semiconductor substrate.

7. The integrated circuit device of claim 1,
wherein the top surface of the electrode landing pad includes a concave surface portion, and
wherein the bottom surface of the through-electrode includes a convex surface portion in contact with the concave surface portion of the top surface of the electrode landing pad.

8. The integrated circuit device of claim 1,
wherein the through-electrode includes:
a conductive plug; and
a first conductive barrier layer covering a sidewall and a bottom surface of the conductive plug,
wherein the electrode landing pad includes:
a conductive core layer; and
a second conductive barrier layer covering a sidewall of the conductive core layer, and
wherein the first conductive barrier layer of the through-electrode is in contact with the conductive core layer of the electrode landing pad.

9. The integrated circuit device of claim 1,
wherein the electrode landing pad includes a conductive core layer and a conductive barrier layer, and
wherein the conductive barrier layer covers at least a portion of an upper surface of the conductive core layer facing the first surface of the semiconductor substrate and a sidewall of the conductive core layer.

10. The integrated circuit device of claim 9, wherein the through-electrode is in contact with the conductive core layer of the electrode landing pad through the conductive barrier layer of the electrode landing pad.

11. The integrated circuit device of claim 1, further comprising:

a first interconnect structure connected to the first insulating layer, the first interconnect structure including a plurality of first conductive lines electrically connected to the through-electrode through the electrode landing pad and a first conductive via extending between the plurality of first conductive lines;

a passivation layer configured to cover the second surface and surround a portion of a sidewall of the through-electrode; and a second interconnect structure on the passivation layer, the second interconnect structure including a plurality of second conductive lines electrically connected to the through-electrode and a second conductive via extending between the plurality of second conductive lines.

12. The integrated circuit device of claim 11, further comprising:

a cover substrate attached to the first interconnect structure; and a connection bump attached to the second interconnect structure and electrically connected to the plurality of second conductive lines.

13. An integrated circuit device comprising:

a semiconductor substrate having a first surface and a second surface opposite to the first surface;

a first insulating layer on the first surface of the semiconductor substrate;

a passivation layer on the second surface of the semiconductor substrate;

an electrode landing pad on the first surface of the semiconductor substrate, the electrode landing pad having a sidewall surrounded by the first insulating layer, a top surface facing the first surface of the semiconductor substrate, and a bottom surface opposite to the top surface, the bottom surface of the electrode landing pad being coplanar with a bottom surface of the first insulating layer, a conductive pad contacting the bottom surface of the electrode landing pad;

a through-electrode penetrating through the semiconductor substrate and the passivation layer and contacting the top surface of the electrode landing pad;

a pad insulating layer having a bottom surface in contact with the electrode landing pad and a top surface in contact with the first surface of the semiconductor substrate;

a first interconnect structure connected to the first insulating layer, the first interconnect structure including a plurality of first conductive lines electrically connected to the through-electrode through the electrode landing pad and a first conductive via extending between the plurality of first conductive lines; and a second interconnect structure on the passivation layer, the second interconnect structure including a plurality of second conductive lines electrically connected to the through-electrode and a second conductive via extending between the plurality of second conductive lines, wherein the through-electrode has a tapered shape with a horizontal width narrowing toward the first surface of the semiconductor substrate, wherein the electrode landing pad has a tapered shape with a horizontal width narrowing toward the first surface of the semiconductor substrate, wherein a horizontal width of the conductive pad is greater than a horizontal width of the bottom surface of the electrode landing pad, and wherein a vertical height of the conductive pad is smaller than a vertical height of the electrode landing pad.

14. The integrated circuit device of claim 13,
wherein the through-electrode includes:
   a conductive plug; and
   a first conductive barrier layer covering a sidewall and a bottom surface of the conductive plug,
wherein the electrode landing pad includes:
   a conductive core layer; and
   a second conductive barrier layer provided between a sidewall of the conductive core layer and the first insulating layer and between an upper surface of the conductive core layer facing the first surface of the semiconductor substrate and the through-electrode, and
wherein the conductive pad includes:
   a conductive layer; and
   a conductive barrier layer provided between the conductive layer and the bottom surface of the electrode landing pad.

15. A semiconductor package comprising:
a first redistribution structure; and
a first integrated circuit device mounted on the first redistribution structure,
wherein the first integrated circuit device includes:
   a semiconductor substrate having a first surface and a second surface opposite to the first surface and facing the first redistribution structure;
   a first insulating layer on the first surface of the semiconductor substrate;
   an electrode landing pad provided on the first surface of the semiconductor substrate, the electrode landing pad having a sidewall surrounded by the first insulating layer, a top surface spaced apart from the first surface of the semiconductor substrate, and
a bottom surface opposite to the top surface;
   a conductive pad contacting the bottom surface of the electrode landing pad; and
   a through-electrode penetrating through the semiconductor substrate and contacting the top surface of the electrode landing pad; and
   a pad insulating layer having a bottom surface in contact with the electrode landing pad and a top surface contact with the first surface of the semiconductor substrate,
wherein the through-electrode has a tapered shape with a horizontal width narrowing toward the first surface of the semiconductor substrate,
wherein the electrode landing pad has a tapered shape with a horizontal width narrowing toward the first surface of the semiconductor substrate,
wherein a horizontal width of the conductive pad is greater than a horizontal width of the bottom surface of the electrode landing pad,
wherein a vertical height of the conductive pad is smaller than a vertical height of the electrode landing pad, and
wherein a bottom surface of the electrode landing pad is coplanar with a bottom surface of the first insulating layer.

16. The semiconductor package of claim 15,
wherein the first integrated circuit device further includes:
   a first interconnect structure connected to the first insulating layer, the first interconnect structure including a plurality of first conductive lines electrically connected to the through-electrode through the electrode landing pad and a first conductive via extending between the plurality of first conductive lines; and
   a second interconnect structure on the second surface of the semiconductor substrate, the second interconnect structure including a plurality of second conductive lines electrically connected to the through-electrode and a second conductive via extending between the plurality of second conductive lines, and
wherein the first integrated circuit device further includes:
   a connection bump provided between the second interconnect structure of the first integrated circuit device and the first redistribution structure.

17. The semiconductor package of claim 16, wherein the first integrated circuit device is configured to receive power through a power signal transmission path that includes a first redistribution pattern of the first redistribution structure, the second interconnect structure of the first integrated circuit device, the through-electrode, and the electrode landing pad.

* * * * *